US012745572B2

(12) United States Patent
Song et al.

(10) Patent No.: US 12,745,572 B2
(45) Date of Patent: Sep. 22, 2026

(54) MEMORY DEVICE INCLUDING BOTTOM ELECTRODE BRIDGES AND METHOD OF MANUFACTURE

(71) Applicant: Taiwan Semiconductor Manufacturing Co., Ltd., Hsinchu (TW)

(72) Inventors: MingYuan Song, Hsinchu (TW); Chien-Min Lee, Zhudong Town (TW); Xinyu Bao, Fremont, CA (US)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 455 days.

(21) Appl. No.: 17/747,757

(22) Filed: May 18, 2022

(65) Prior Publication Data

US 2023/0263074 A1 Aug. 17, 2023

Related U.S. Application Data

(60) Provisional application No. 63/268,076, filed on Feb. 16, 2022.

(51) Int. Cl.

| | |
|---|---|
| ***H10N 52/80*** | (2023.01) |
| ***H10B 61/00*** | (2023.01) |
| ***H10N 50/85*** | (2023.01) |
| ***H10N 52/00*** | (2023.01) |
| ***H10N 52/01*** | (2023.01) |

(52) U.S. Cl.

CPC ............. *H10N 52/80* (2023.02); *H10B 61/00* (2023.02); *H10N 50/85* (2023.02); *H10N 52/00* (2023.02); *H10N 52/01* (2023.02)

(58) Field of Classification Search

CPC ........ H10N 52/80; H10N 52/01; H10N 52/00; H10N 50/85; H10N 50/01; H10N 50/10; H10B 61/00; H10B 61/22

See application file for complete search history.

(56) References Cited

U.S. PATENT DOCUMENTS

| | | | |
|---|---|---|---|
| 10,593,388 B2 | 3/2020 | Shiokawa et al. | |
| 2014/0252439 A1 | 9/2014 | Guo | |
| 2014/0313839 A1 | 10/2014 | Sakui et al. | |
| 2016/0042778 A1 | 2/2016 | Manipatruni et al. | |
| 2016/0043778 A1 | 2/2016 | Sikina et al. | |
| 2018/0061467 A1* | 3/2018 | Kan | G11C 11/1659 |

(Continued)

FOREIGN PATENT DOCUMENTS

| | | |
|---|---|---|
| CN | 108886061 A | 11/2018 |
| CN | 112103386 A | 12/2020 |

(Continued)

*Primary Examiner* — Latanya N Crawford Eason

(74) *Attorney, Agent, or Firm* — Slater Matsil, LLP

(57) ABSTRACT

A magnetic memory device including bottom electrode bridges and a spin-orbit torque structure overlapping and physically coupled to the bottom electrode bridges and a method of forming the same are disclosed. In an embodiment, a memory includes a first electrode on a first via; a second electrode on a second via; a spin-orbit torque (SOT) structure physically and electrically coupled to the first electrode and the second electrode, the SOT structure overlapping the first electrode and the second electrode; and a magnetic tunnel junction (MTJ) on the SOT structure.

19 Claims, 26 Drawing Sheets

(56) References Cited

U.S. PATENT DOCUMENTS

2019/0009478 A1 1/2019 Kirkeby
2019/0013354 A1 1/2019 Lee et al.
2019/0057732 A1 2/2019 Shiokawa et al.
2019/0080738 A1 3/2019 Choi et al.
2019/0304523 A1 10/2019 O'Brien et al.
2020/0006631 A1* 1/2020 Sato ...................... H10N 50/85
2020/0006644 A1* 1/2020 Zhao ...................... H10N 50/80
2020/0075670 A1 3/2020 Lin et al.
2020/0227105 A1* 7/2020 Gosavi .................... G11C 11/18
2020/0286536 A1 9/2020 Fukami et al.
2020/0365308 A1* 11/2020 Lin ...................... H10N 50/85
2020/0395530 A1 12/2020 Tsou et al.
2021/0082998 A1* 3/2021 Lee .................... H01L 23/5226
2021/0104663 A1* 4/2021 Haq ...................... H10N 50/85
2021/0134882 A1 5/2021 Lin et al.
2021/0159390 A1* 5/2021 Reznicek ............... H10N 50/80
2021/0167281 A1 6/2021 Wang et al.
2021/0202827 A1 7/2021 Song et al.
2021/0295887 A1* 9/2021 Martin .................. H10B 61/00
2021/0351342 A1* 11/2021 Yui ....................... H10N 50/01
2021/0367143 A1 11/2021 Lee et al.
2021/0399211 A1 12/2021 Tsumita et al.
2022/0059760 A1* 2/2022 Crotti .................... G11C 11/161
2022/0190234 A1* 6/2022 Sasaki .................... H10B 61/22
2023/0107965 A1 4/2023 Ishitani

FOREIGN PATENT DOCUMENTS

CN 112750856 A 5/2021
CN 113129955 A 7/2021
CN 113314666 A 8/2021
JP 2019009478 A 1/2019
TW 201724594 A 7/2017
WO 2017208576 A1 12/2017
WO 2019005172 A1 1/2019
WO 2020194660 A1 10/2020
WO 2021181651 A1 9/2021

* cited by examiner 106
27
14
716

711
27
24
22
20
18
106
14
206
108
716
708

MEMORY DEVICE INCLUDING BOTTOM ELECTRODE BRIDGES AND METHOD OF MANUFACTURE

CROSS-REFERENCE TO RELATED APPLICATIONS

This application claims the benefit of U.S. Provisional Application No. 63/268,076, filed on Feb. 16, 2022, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is magnetoresistive random-access memory (MRAM). A plurality of MRAM cells, each storing a bit of data, may be arranged in an MRAM array. Each of the MRAM cells may include a magnetic tunnel junction (MTJ) stack, which includes two ferromagnetic plates separated by a thin insulator. The magnetic polarity of a first of the ferromagnetic plates is fixed, while the polarity of the second of the ferromagnetic plates is free. A logic "0" or "1" may be stored in the MTJ by varying the polarity of the second ferromagnetic plate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
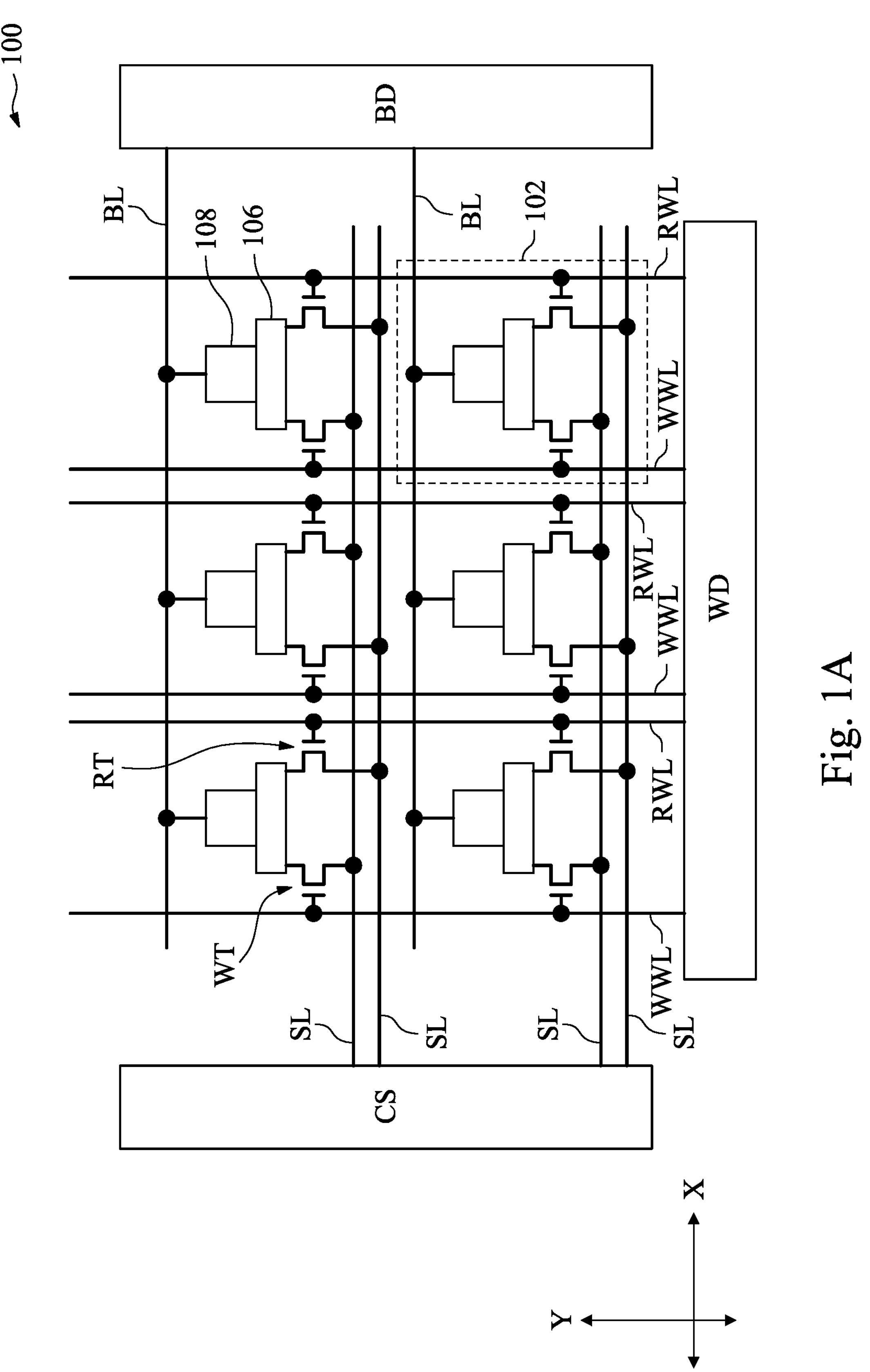
FIG. 1A is a circuit diagram of a memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods for forming magnetoresistive random-access memory (MRAM) devices and MRAM devices formed by the same. The method includes forming a bottom electrode bridge on a bottom electrode, forming a spin-orbit torque (SOT) structure on the bottom electrode bridge, forming a magnetic tunnel junction (MTJ) film stack on the SOT structure, and patterning the MTJ film stack and the SOT structure. The bottom electrode bridge is formed of a material such as tungsten (W), platinum (Pt), tantalum (Ta), tantalum nitride (TaN), titanium nitride (TiN), aluminum (Al), combinations or multiple layers thereof, or the like. The bottom electrode bridge may be formed of a wide variety of materials, and forming the bottom electrode bridge of the listed materials improves contact resistance between the bottom electrode and the SOT structure. The SOT structure and the MTJ film stack are patterned such that the SOT structure and the MTJ film stack at least partially overlap the bottom electrode bridge. The SOT structure may be patterned such that opposite side surfaces of the SOT structure do not extend laterally past side surfaces of a pair of adjacent bottom electrode bridges. The SOT structure is formed directly on and in physical contact with the bottom electrode bridge. The bottom electrode bridge acts as an etch stop layer for the patterning of the SOT structure, which prevents over-etching of the SOT structure. This reduces damage to underlying structures, improves the process window for patterning the SOT structure, reduces device defects, and improves device yield. Moreover, the SOT structure may be fully etched while shunting underneath the MTJ film stack is prevented, improved tunnel magnetoresistance (TMR) effects are obtained, and device performance is improved.

Figure 1B:
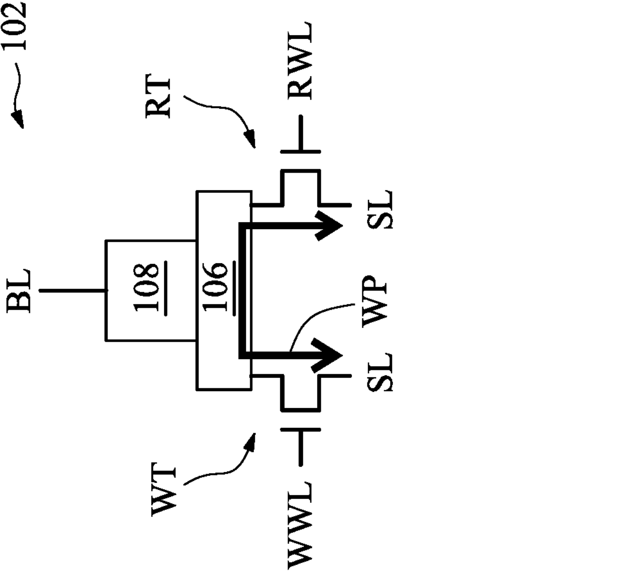
FIG. 1B illustrates a write path in a selected unit cell of the memory array, in accordance with some embodiments.
Figure 1C:
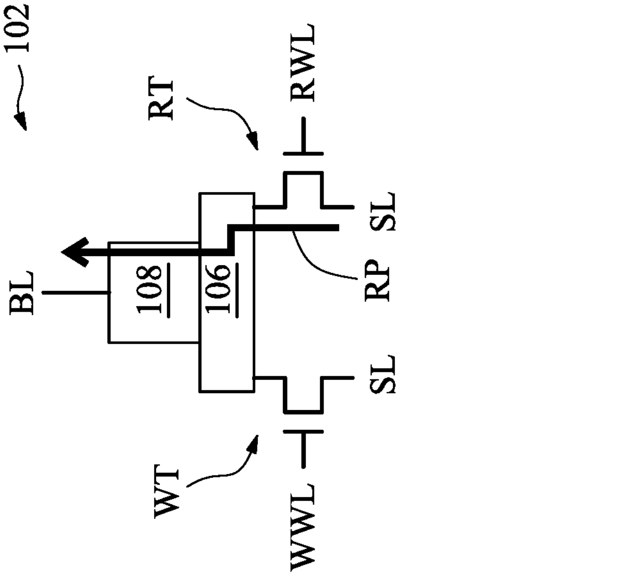
FIG. 1C illustrates a read path in a selected unit cell of the memory array, in accordance with some embodiments.

FIG. 1A is a circuit diagram schematically illustrating a memory array 100, in accordance with some embodiments. FIG. 1B illustrates a write path in a selected unit cell 102 in the memory array 100 of FIG. 1A. FIG. 1C illustrates a read path in a selected unit cell 102 in the memory array 100 of FIG. 1A.

In FIG. 1A, the memory array 100 is a magnetic random access memory (MRAM) array. The memory array 100 includes a plurality of unit cells 102 arranged along rows and columns. The unit cells 102 in each row may be arranged along a direction X, while the unit cells 102 in each column may be arranged along a direction Y. In some embodiments, each column of the unit cells 102 is coupled to a pair of a write word line WWL and a read word line RWL, and each row of the unit cells 102 is coupled to a bit line BL as well as a pair of source lines SL. Each of the unit cells 102 may be defined between one of the write word lines WWL and one of the read word lines RWL, and between one of the bit lines BL and two of the source lines SL. In addition, the write word lines WWL and the read word lines RWL may extend along the direction Y, and the bit lines BL and the source lines SL may extend along the direction X.

Each of the unit cells 102 includes a magnetic tunnel junction (MTJ) 108 and a spin-orbit torque (SOT) structure 106. The MTJ 108 acts as a storage element, and the SOT structure 106 is used to switch a magnetization orientation and electrical resistance of the MTJ 108. Magnetization orientations of ferromagnetic layers in the MTJ 108 determine an electrical resistance of the MTJ 108. The MTJ 108 has a low-electrical resistance state when the magnetization orientations are in a parallel state. The MTJ 108 has a high-electrical resistance state when the magnetization orientations are in an anti-parallel state. By altering the magnetization orientations of the ferromagnetic layers in the MTJ 108, the MTJ 108 can be programmed to store complementary logic states (e.g., a logic high state indicating the high-electrical resistance state and a logic low state indicating the low-electrical resistance state).

The MTJ 108 may be programmed by utilizing a spin Hall effect. Each of the MTJs 108 is formed on a spin-orbit torque (SOT) structure 106. During a programming operation, an in-plane charge current passing through the SOT structure 106 is converted to a perpendicular spin current via the spin Hall effect. The perpendicular spin current then flows into a ferromagnetic layer of the MTJ 108 and switches the magnetization orientation of the ferromagnetic layer via spin-orbit torque (SOT). As such, the memory array 100 may be referred to as a spin-orbit torque MRAM (SOT-MRAM) array. In this way, the magnetization orientations of the MTJs 108 (e.g., the electrical resistance of the MTJs 108) can be altered, and bit data can be programmed into the MTJs 108. During a read operation, the resistance state of an MTJ 108 can be sensed and the bit data stored in the MTJ 108 can be read out.

As illustrated in FIG. 1A, each of the unit cells 102 further includes a write transistor WT and a read transistor RT. The write transistor WT and the read transistor RT in each of the unit cells 102 are coupled to the SOT structure 106. The write transistor WT and the read transistor RT may be coupled to portions of the SOT structure 106 at opposite sides of the MTJ 108, such that the MTJ 108 stands on a write current path (e.g., the in-plane charge current described above) between the write transistor WT and the read transistor RT. Accordingly, the MTJ 108 can be programmed by the write current. The write transistors WT and the read transistors RT may be three-terminal devices. A gate terminal of each write transistor WT may be coupled to one of the write word lines WWL and a gate terminal of each read transistor RT may be coupled to one of the read word lines RWL. The write transistor WT and the read transistor RT in each of the unit cells 102 are coupled to the SOT structure 106 through a first source/drain terminal and are coupled to one of the source lines SL through a second source/drain terminal. The write transistor WT and the read transistor RT in each of the unit cells 102 may be coupled to two of the source lines SL. A terminal of each of the MTJs 108 is coupled to an underlying SOT structure 106, and the other terminal of each of the MTJs 108 is coupled to one of the bit lines BL.

A word line driver circuit WD is coupled to the write word lines WWL and the read word lines RWL and configured to control switching of the write transistors WT and the read transistors RT through the write word lines WWL and the read word lines RWL. A current source circuit CS is coupled to the source lines SL. The current source circuit CS is configured to provide the write current (e.g., the in-plane charge current described above) for programming the MTJs 108 as well as a read current for sensing the resistance states of the MTJs 108. The current source circuit CS is used in conjunction with the word line driver circuit WD. A bit line driver circuit BD is coupled to the bit lines BL. The bit line driver circuit BD is configured to sense the read current passing through the MTJs 108 in order to identify the resistance states of the MTJs 108.

Referring to FIGS. 1A and 1B, during a programming operation, the write transistor WT and the read transistor RT of a selected unit cell 102 are both turned on and a write current WP (e.g., the in-plane charge current as described above) flows through the write transistor WT, the read transistor RT, and the SOT structure 106 between the write transistor WT and the read transistor RT. As a result of spin-orbit interaction, the write current WP flowing through the SOT structure 106 induces a SOT on the MTJ 108, which programs the MTJ 108. The write transistor WT and the read transistor RT are turned on by setting the corresponding write word line WWL and the corresponding read word line RWL, and the write current WP is provided by setting a voltage difference between two corresponding source lines SL. The bit line BL may be floating.

Referring to FIGS. 1A and 1C, during a read operation, the read transistor RT of a selected unit cell 102 is turned on, while the write transistor WT in the selected unit cell 102 is turned off. A voltage difference may be set between the bit line BL and the source line SL coupled to the read transistor RT such that a read current RP flows through the MTJ 108 connected between the read transistor RT and the bit line BL. The MTJ 108 may have different electrical resistances based on whether the ferromagnetic layers of the MTJ 108 have parallel magnetization orientations (e.g., indicating the MTJ 108 is in the low-resistance state) or anti-parallel magnetization orientations (e.g., indicating the MTJ 108 is in the high-resistance state). This variable resistance affects a value of the read current RP or a value of a voltage drop across the MTJ 108. Therefore, the bit data (e.g., the resistance state) stored in the MTJ 108 can be read out. The source line SL coupled to the write transistor WT may be floating.

Figure 2:
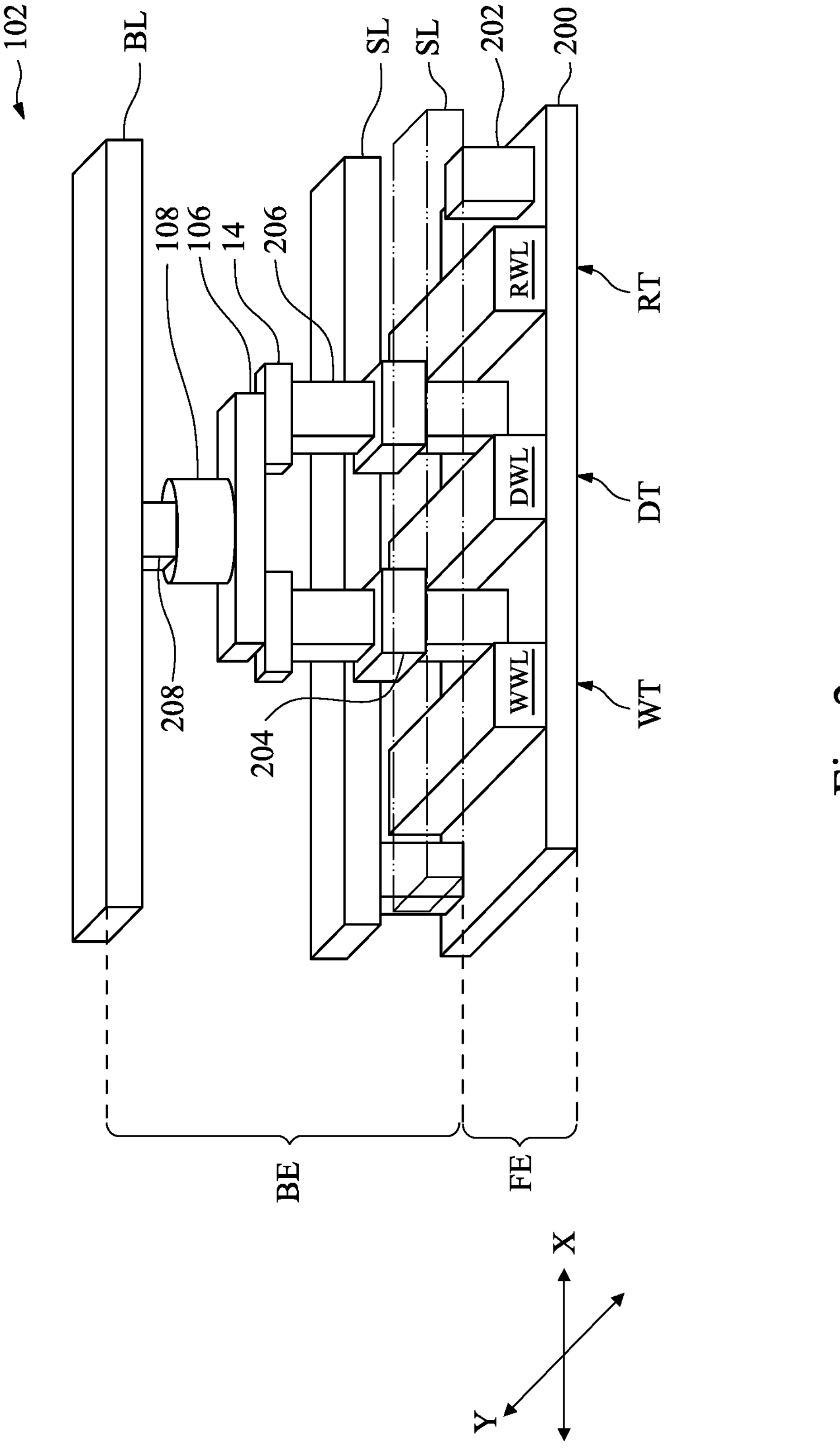
FIG. 2 is a schematic three-dimensional view of a unit cell of the memory array, in accordance with some embodiments.

FIG. 2 is a schematic three-dimensional view illustrating one of the unit cells 102 of FIG. 1A. In FIG. 2, the write transistor WT and the read transistor RT of a unit cell 102 are formed in a front-end-of-line (FEOL) structure FE of a device wafer. A gate terminal of the write transistor WT may be provided by a write word line WWL on a substrate 200. Similarly, a gate terminal of the read transistor RT may be provided by a read word line RWL on the substrate 200. The write word line WWL and the read word line RWL may be laterally spaced apart from one another and may extend along the direction Y. Source and drain terminals (not separately illustrated) of the write transistor WT are located on opposite sides of the write word line WWL, and source and drain terminals (not separately illustrated) of the read transistor RT are located on opposite sides of the read word line RWL.

In embodiments in which the write transistor WT and the read transistor RT are planar-type transistors, the write word line WWL and the read word line RWL are on a planar surface of the substrate 200. The source and drain terminals of the write transistor WT and the read transistor RT may be doped regions or epitaxial structures (not separately illustrated) formed in the substrate 200. In embodiments in which the write transistor WT and the read transistor RT are fin-type transistors (e.g., FinFETs), the write word line WWL and the read word line RWL are on a fin structure on the substrate 200. The source and drain terminals of the write transistor WT and the read transistor RT may be epitaxial structures (not separately illustrated), which may be formed in the fin structures on opposite sides of the write word line WWL and the read word line RWL. In embodiments in which the write transistor WT and the read transistor RT are nanostructure (e.g., nanosheet, nanowire, gate-all-around, or the like) field effect transistors (NSFETs), stacks of nanostructures on the substrate 200 are wrapped by a write word line WWL or a read word line RWL. The source and drain terminals of the write transistor WT and the read transistor RT may be epitaxial structures (not separately illustrated), which may be formed in contact (e.g., in lateral contact) with the stacks of nanostructures on opposite sides of the write word line WWL and the read word line RWL. Contact plugs 202 may be on the source/drain terminals of the write transistor WT and the read transistor RT. The contact plugs 202 are electrically coupled to the source/drain terminals, and provide connections between the source/drain terminals and overlying conductive components.

In some embodiments, a dummy word line DWL is formed between the write word line WWL and the read word line RWL. The dummy word line DWL, the write word line WWL, and the read word line RWL may extend along the same direction, such as the direction Y. A gate terminal of a dummy transistor DT formed between the write transistor WT and the read transistor RT may be coupled to the dummy word line DWL. The dummy transistor DT may be structurally the same as or similar to the write transistor WT and the read transistor RT. The write transistor WT and the read transistor RT may each share one of their source/drain terminals with the dummy transistor DT. In some embodiments, the dummy word line DWL is configured to receive a gate voltage, which may ensure an off state of the dummy transistor DT. This reduces interference between the write transistor WT and the read transistor RT. Accordingly, the dummy transistor DT including the dummy word line DWL may be referred as an isolation transistor.

The source lines SL, the SOT structure 106, the MTJ 108 and the bit line BL may be formed in a back-end-of-line (BEOL) structure BE formed on the FEOL structure FE. In some embodiments, the source lines SL coupled to the write transistor WT and the read transistor RT are portions of a bottom metallization layer in the BEOL structure BE, and may extend along the direction X. The source lines SL are coupled to the source/drain terminals of the write transistor WT and the read transistor RT through the contact plugs 202. Others of the source/drain terminals of the write transistor WT and the read transistor RT are coupled to landing pads 204, which may also be formed in the bottom metallization layer of the BEOL structure BE. The landing pads 204 may be coupled to the source/drain terminals of the write transistor WT and the read transistor RT by the contact plugs 202.

The SOT structure 106 and the MTJ 108 may be formed on the bottom metallization layer. The SOT structure 106 may be coupled to the landing pads 204 in the bottom metallization layer through bottom vias 206 and bottom electrode bridges 14. The bottom vias 206 may be referred to as bottom electrodes. As illustrated in FIG. 2, the SOT structure 106 may extend at least partially over the bottom electrode bridges 14, and may be physically and electrically coupled to the bottom electrode bridges 14. The bottom electrode bridges 14 may be included to prevent device defects caused by over-etching the SOT structure 106, and to improve contact resistance between the bottom vias 206 and the SOT structure 106, reducing device defects and improving device performance. The SOT structure 106 may be coupled to the source/drain terminals of the write transistor WT and the read transistor RT through the bottom electrode bridges 14, the bottom vias 206, the landing pads 204, and the contact plugs 202. The MTJ 108 is formed on the SOT structure 106 between the bottom vias 206. The MTJ 108 is on a path of the write current flowing between the bottom vias 206. The bit line BL may be formed in a metallization layer on the MTJ 108, and may extend along the direction X. In some embodiments, the bit line BL is electrically connected to the MTJ 108 through a top via 208.

FIGS. 3 through 18 illustrate cross-sectional and top-down views of intermediate steps in the formation of the memory array 100 of FIG. 1A. FIGS. 7B, 8B, 9B, 10B, 11B, 12B, 15A, 16A, and 17A illustrate enlarged, detailed, cross-sectional views of intermediate steps in the formation of the bottom electrode bridges 14, the SOT structure 106, and the MTJ 108. FIGS. 7C, 8C, 9C, 10C, 11C, 12C, 15B, 16B, and 17B illustrate enlarged, detailed, top-down views of intermediate steps in the formation of the bottom electrode bridges 14, the SOT structure 106, and the MTJ 108.

Figure 3:
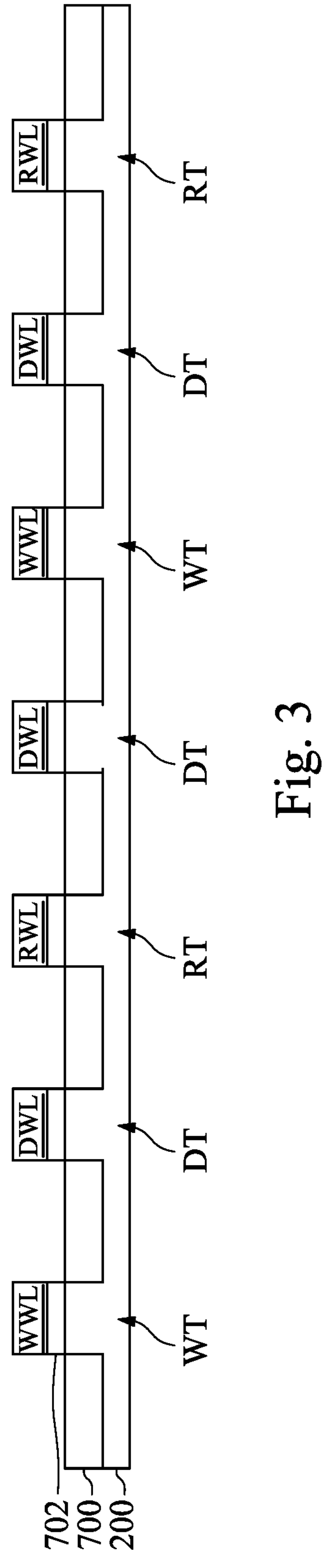
FIGS. 3 through 18 are cross-sectional views of intermediate stages in the manufacturing of semiconductor devices, in accordance with some embodiments.

In FIG. 3, write transistors WT, read transistors RT, and dummy transistors DT are formed on a substrate 200. As described above with reference to FIGS. 1A through 2, each of the unit cells 102 may include one of the write transistors WT and one of the read transistors RT. In embodiments in which the transistors are planar-type transistors, the write transistor WT includes a write word line WWL formed on a planar surface of the substrate 200 and source/drain regions 700 formed in the substrate 200. The read transistor RT includes a read word line RWL formed on a planar surface of the substrate 200 and source/drain regions 700 formed in the substrate 200. The write word line WWL and the read word line RWL are separated from the substrate 200 by a gate dielectric layer 702. In some embodiments, the dummy transistors DT are formed along with the write transistor WT and the read transistor RT. The dummy word lines DWL may be formed between a write transistor WT and an adjacent read transistor RT, and separated from the substrate 200 by a gate dielectric layer 702.

The write transistors WT, the read transistors RT and the dummy transistors DT have been described as planar-type transistors. However, in some embodiments, the write transistors WT, the read transistors RT, and the dummy transistors DT may be FinFETs, NSFETs, or the like as described with reference to FIG. 2, and the structures of the elements in the write transistors WT, the read transistors RT, and the dummy transistors DT may be modified accordingly.

The substrate 200 may be a semiconductor substrate, such as silicon, doped or un-doped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

Figure 4:
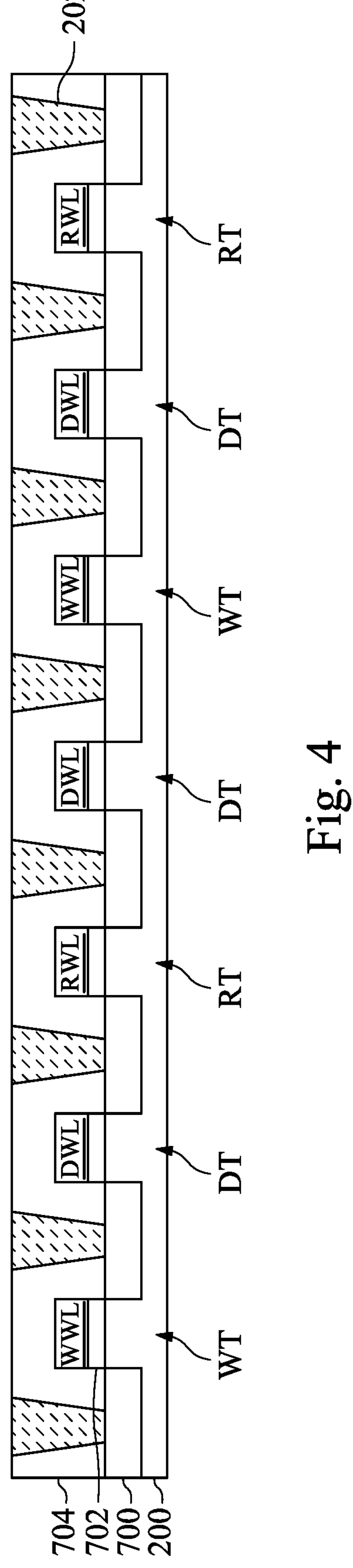

In FIG. 4, a dielectric layer 704 and contact plugs 202 are formed on the write transistors WT, the read transistors RT, and the dummy transistors DT. The dielectric layer 704 may cover the write transistors WT, the read transistors RT, and the dummy transistors DT. The contact plugs 202 may penetrate through the dielectric layer 704 and may be physically and electrically coupled to the source/drain regions 700. In some embodiments, the dielectric layer 704 and the contact plugs 202 are formed by a damascene process (e.g., a single damascene process).

In some embodiments, the dielectric layer 704 is formed of a suitable dielectric material including, for example, a nitride such as silicon nitride, an oxide such as silicon oxide, SiOC, and SiOCN, SiCN, phosphosilicate glass (PSG), borosilicate glass (BSG), boron-doped phosphosilicate glass (BPSG), the like, or combinations thereof. In some embodiments, the dielectric layer 704 may be a low-k dielectric material, such as a dielectric material having a dielectric constant (k-value) lower than about 3.0. In some embodiments, the contact plugs 202 are made of one or more of aluminum, cobalt, copper, a copper alloy, tungsten, titanium, titanium nitride, tantalum, tantalum nitride, alloys thereof, the like, or combinations thereof. The contact plugs 202 may include barrier and/or adhesion material layers surrounding the sides of the vias and formed of one or more layers of titanium, titanium nitride, tantalum, tantalum nitride, tungsten nitride, ruthenium, rhodium, platinum, other noble metals, other refractory metals, their nitrides, combinations of these, or the like.

Figure 5:
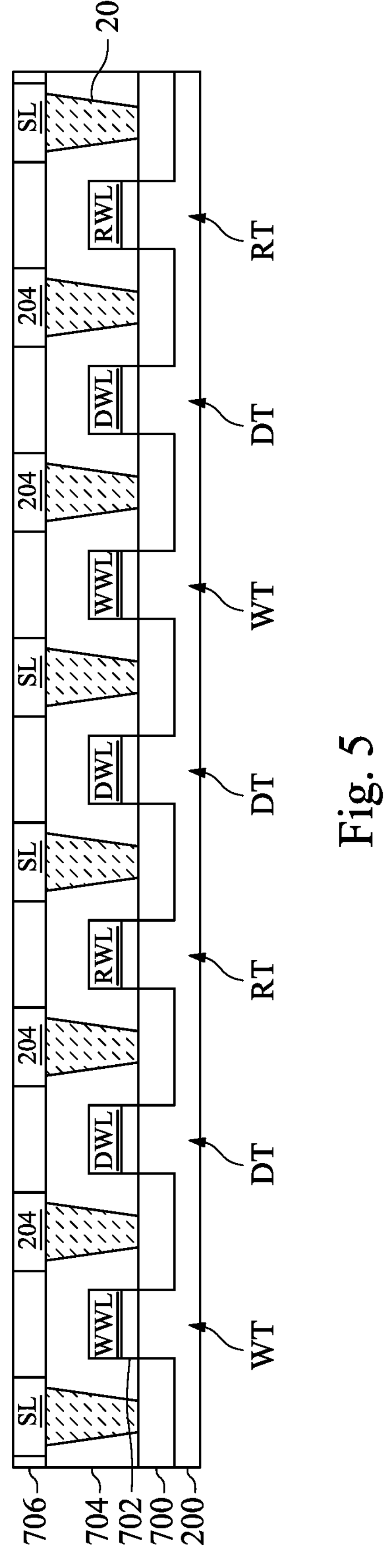

In FIG. 5, a dielectric layer 706, source lines SL, and landing pads 204 are formed on the dielectric layer 704 and the contact plugs 202. The dielectric layer 706 may laterally surround the source lines SL and the landing pads 204. The source lines SL and the landing pads 204 may be physically and electrically coupled to the contact plugs 202. A pair of a source line SL and a landing pad 204 may be coupled to the source/drain regions 700 of each of the write transistors WT through the contact plugs 202. Similarly, a pair of a source line SL and a landing pad 204 may be coupled to the source/drain regions 700 of each of the read transistors RT through the contact plugs 202. In some embodiments, the dielectric layer 706, the source lines SL, and the landing pads 204 are formed by a damascene process (e.g., a single damascene process). The dielectric layer 706 may be formed of materials similar to or the same as the materials of the dielectric layer 704, and the source lines SL and the landing pads 204 may be formed of materials similar to or the same as the materials of the contact plugs 202.

Figure 6:
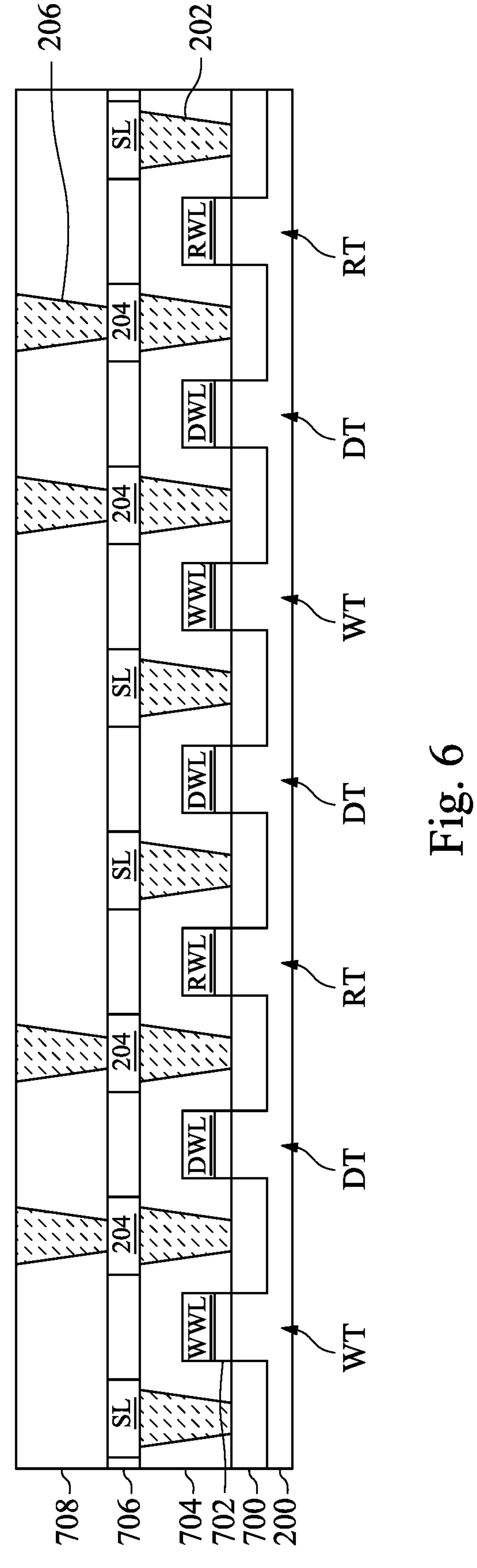

In FIG. 6, a dielectric layer 708 and bottom vias 206 are formed on the dielectric layer 706, the source lines SL, and the landing pads 204. The bottom vias 206 may penetrate through the dielectric layer 708 and may be physically and electrically coupled to the landing pads 204. As such, a first source/drain region 700 of each write transistor WT is coupled to a source line SL, and a second source/drain region 700 of each write transistor WT is coupled to a bottom via 206 through a landing pad 204 and a contact plug 202. Similarly, a first source/drain region 700 of each read transistor RT is coupled to a source line SL, and a second source/drain region 700 of each read transistor RT is coupled to a bottom via 206 through a landing pad 204 and a contact plug 202. In some embodiments, the dielectric layer 708 and the bottom vias 206 are formed by a damascene process (e.g., a single damascene process). The dielectric layer 708 may be formed of materials similar to or the same as the materials of the dielectric layer 704, and the bottom vias 206 may be formed of materials similar to or the same as the materials of the contact plugs 202.

Figure 7A:
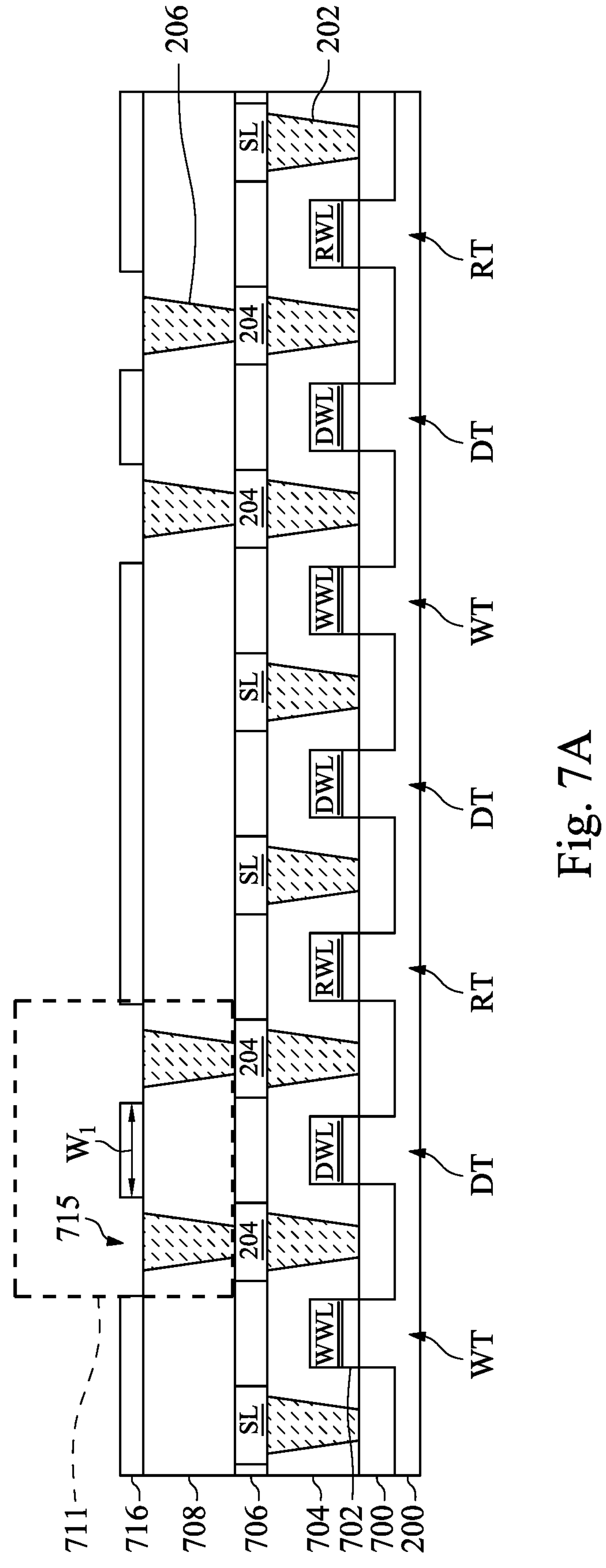
Figures 7B, 7C:
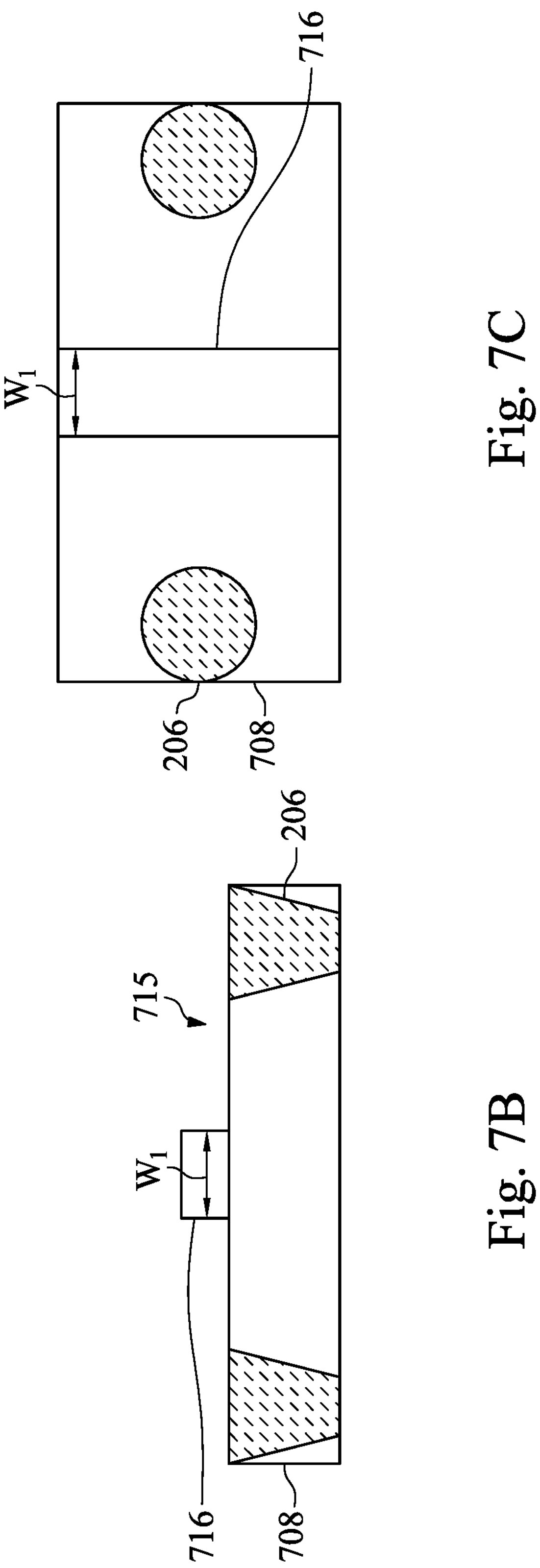

In FIGS. 7A through 7C, a dielectric layer 716 is formed on the dielectric layer 708 and the bottom vias 206. FIG. 7B illustrates a detailed view of a region 711 of FIG. 7A. FIG. 7C illustrates a top-down view of the region 711 of FIG. 7A. The dielectric layer 716 may be formed of materials similar to or the same as the materials of the dielectric layer 704. The dielectric layer 716 may be formed using an acceptable deposition process, such as spin coating, physical vapor deposition (PVD), chemical vapor deposition (CVD), the like, or a combination thereof. The dielectric layer 716 may be patterned to form openings 715 exposing the bottom vias 206 and portions of the dielectric layer 708. Bottom electrode bridges may be subsequently formed in the openings 715. The dielectric layer 716 may be patterned using suitable photolithography and etching processes. For example, a photoresist structure (not separately illustrated) may be formed on the dielectric layer 716 and patterned. The openings 715 may be formed by etching the dielectric layer 716 using the patterned photoresist structure as an etching mask. The dielectric layer 716 may be etched using a suitable etching process, such as a wet etching process or a dry etching process. The patterned photoresist structure may then be removed, such as by an acceptable ashing process.

Portions of the dielectric layer 716 remaining laterally between adjacent write transistors WT and read transistors RT may have widths W1 ranging from about 20 nm to about 200 nm. Etching the dielectric layer 716 such that remaining portions of the dielectric layer 716 between the write transistors WT and the read transistors RT have the prescribed widths ensures that bottom electrode bridges subsequently formed in the openings 715 are isolated from one another, and SOT structures subsequently formed on the bottom electrode bridges extend over the bottom electrode bridges, without having excessive lengths.

Figure 8A:
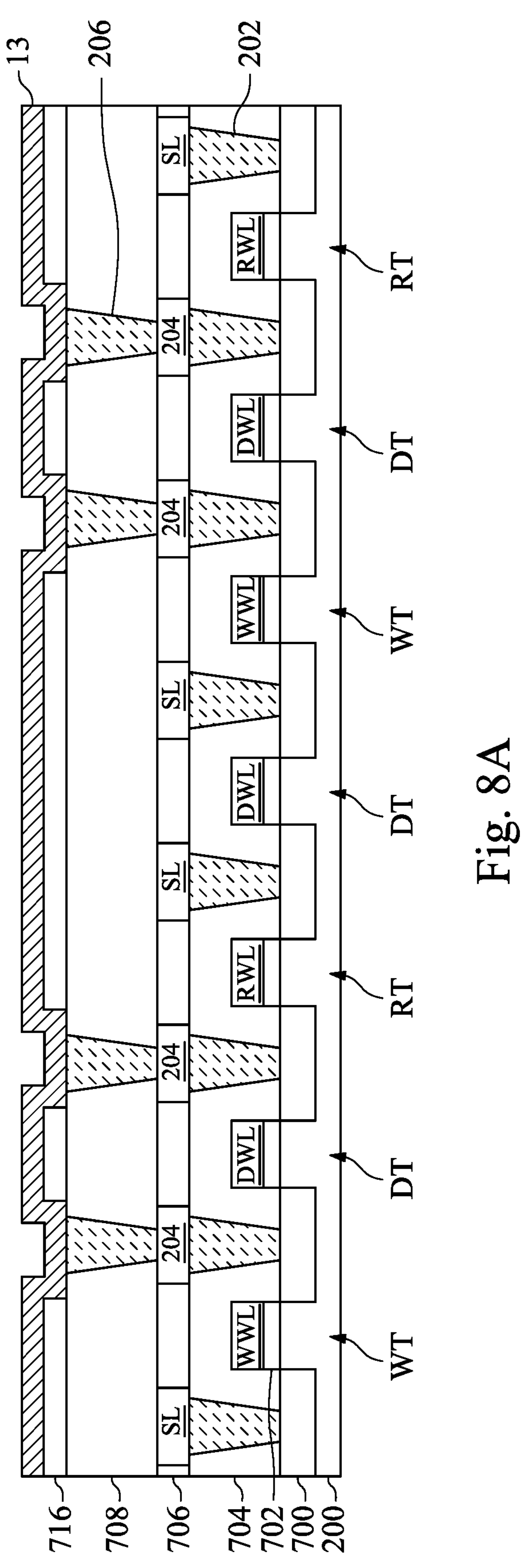
Figure 8C:
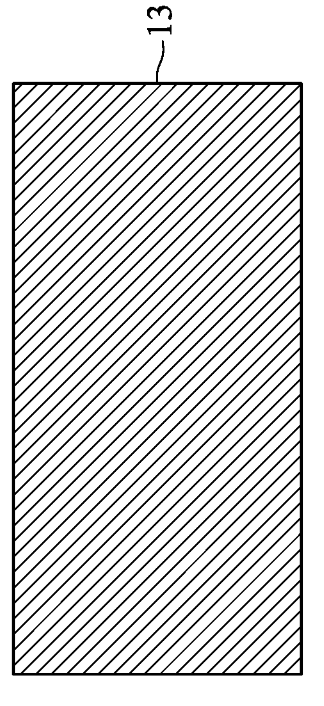
Figure 8B:
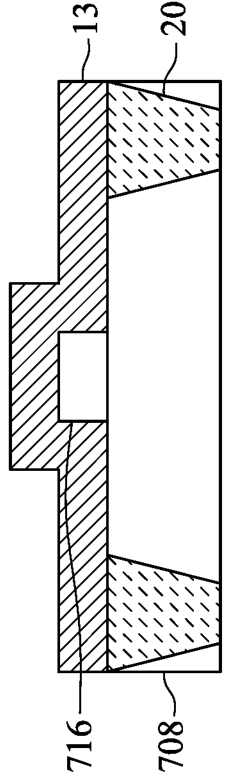

In FIGS. 8A through 8C, a bottom electrode bridge layer 13 is formed on the dielectric layer 708, the dielectric layer 716, and the bottom vias 206 and filling the openings 715. The bottom electrode bridge layer 13 may be formed of a suitable material, such as tungsten (W), platinum (Pt), tantalum (Ta), tantalum nitride (TaN), titanium nitride (TiN), aluminum (Al), combinations or multiple layers thereof, or the like. The bottom electrode bridge layer 13 may be deposited using a suitable process, such as CVD, PVD, atomic layer deposition (ALD), plating, or the like. The bottom electrode bridge layer 13 may be formed of conductive materials having high etch resistances relative to materials of subsequently formed SOT structures, which allows for the bottom electrode bridge layer 13 to act as an etch stop layer.

Figure 9A:
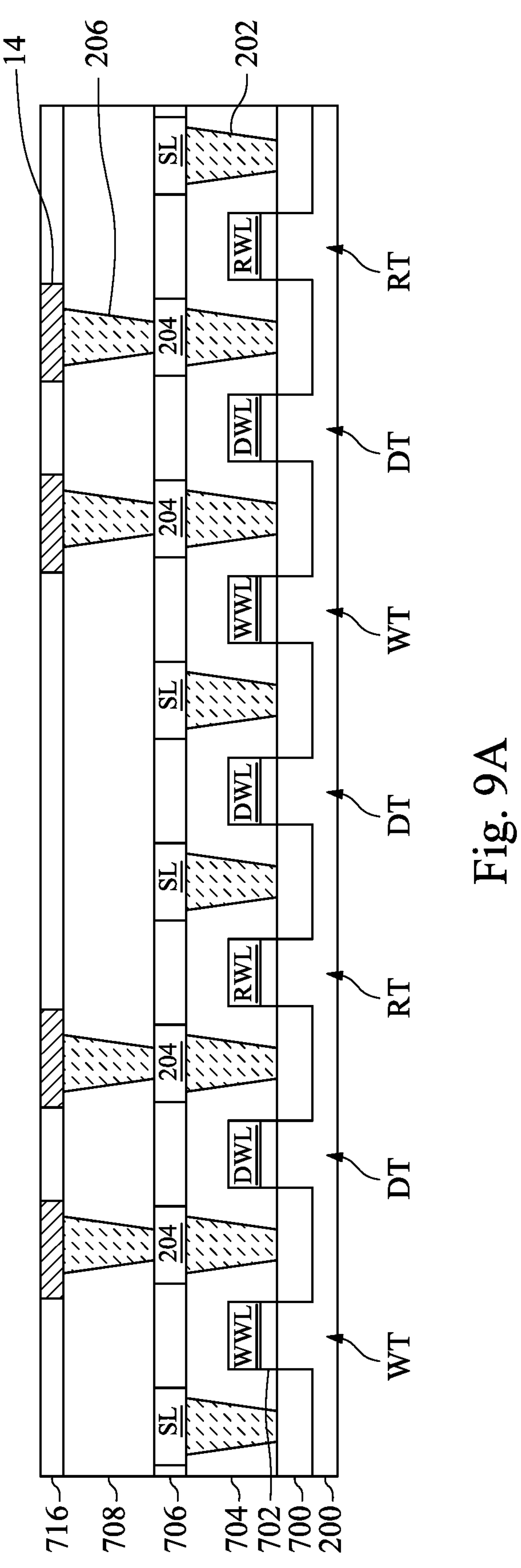
Figure 9C:
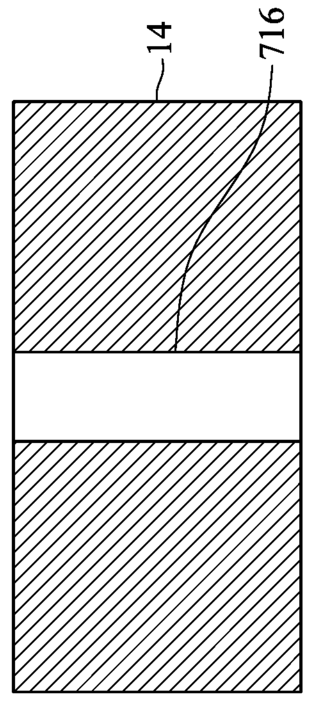
Figure 9B:
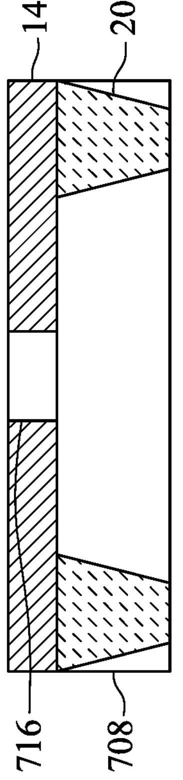

In FIGS. 9A through 9C, a planarization process, such as a CMP, is performed on the bottom electrode bridge layer 13 to form bottom electrode bridges 14. After the planarization process, top surfaces of the dielectric layer 716 and the bottom electrode bridges 14 may be level with one another, within process variations. Accordingly, the top surfaces of the dielectric layer 716 are exposed through the bottom electrode bridges 14.

Figure 10A:
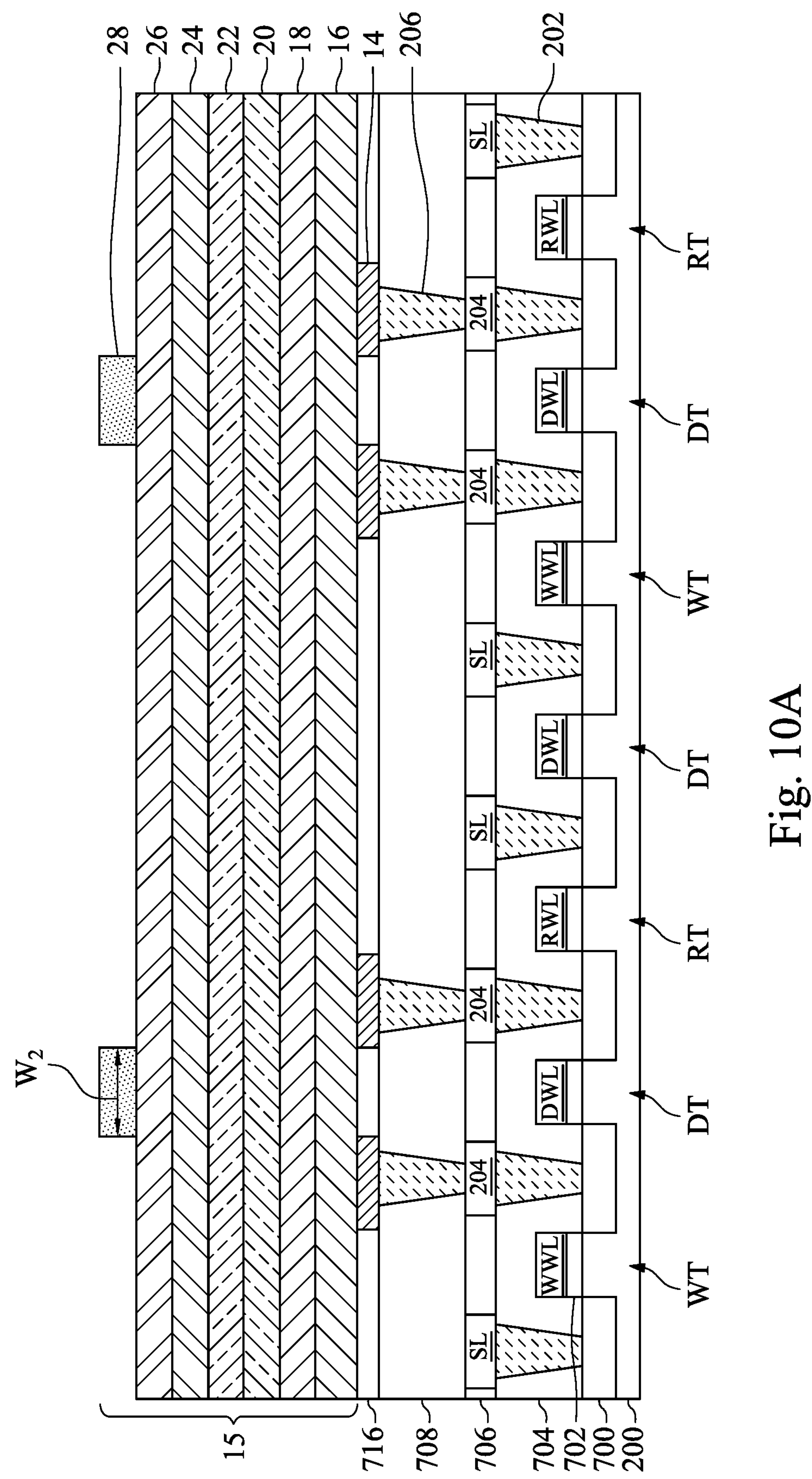
Figure 10C:
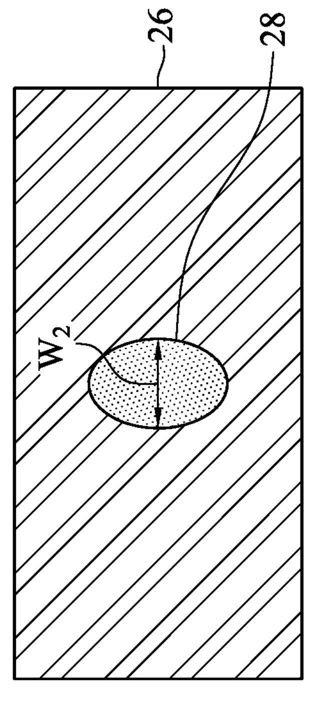
Figure 10B:
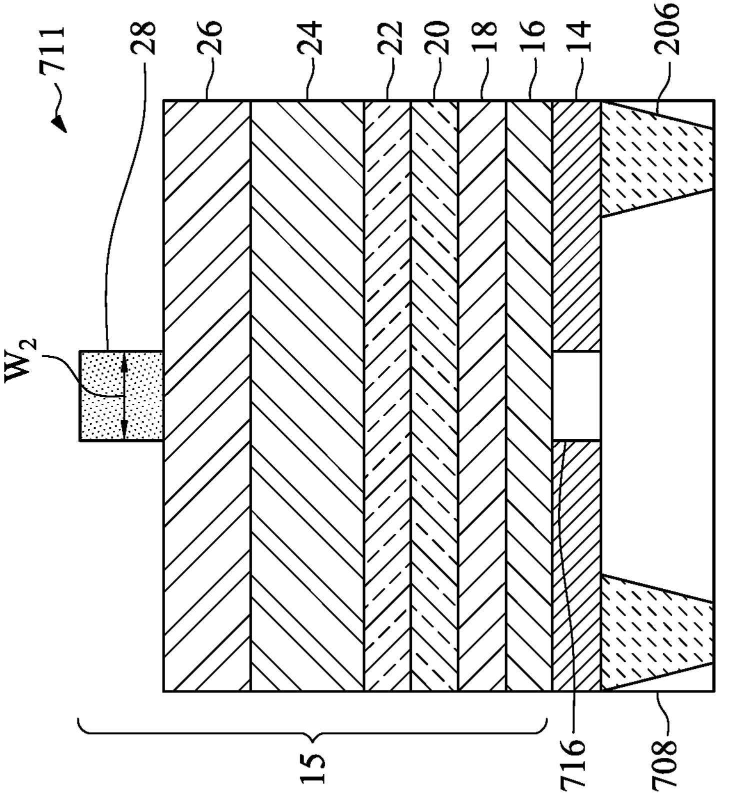

In FIGS. 10A through 10C, a multi-layer film stack 15 is formed on the bottom electrode bridges 14 and the dielectric layer 716. The multi-layer film stack 15 includes an SOT structure 16, a free layer 18, a barrier layer 20, a reference layer 22, a pinned layer 24, a top electrode layer 26, and a patterned photoresist 28. The layers of the multi-layer film stack 15 described in FIGS. 10A through 10C are a representative example, and SOT MRAM devices may be formed with different layers, materials, arrangements, compositions, or dimensions, variations of which are considered within the scope of the present disclosure. The layers of the multi-layer film stack 15 may be deposited using one or more suitable deposition techniques, depending on the material being deposited. The deposition techniques may include techniques such as CVD, PVD, ALD, sputtering, plating, the like, or a combination thereof.

The SOT structure 16 may be deposited on the dielectric layer 716 and the bottom electrode bridges 14. In some embodiments, the SOT structure 16 is in physical contact with the dielectric layer 716 and is physically and electrically coupled to the bottom electrode bridges 14. The SOT structure 16 acts as a generator of a spin-polarized current in subsequently completed unit cells 102. By conducting a current through the SOT structure 16, spin-polarized currents are generated in transverse directions, and these spin-polarized currents are used to control the magnetic moment of the overlying free layer 18.

In some embodiments, the SOT structure 16 is formed of a heavy metal or a metal alloy, such as tungsten (W), platinum (Pt), tantalum (Ta), multiple layers thereof, alloys thereof, combinations thereof, or the like. The SOT structure 16 may have a thickness in a range from about 3 nm to about 20 nm. In some embodiments, the SOT structure 16 may be formed of a plurality of sub-layers. For example, the SOT structure 16 may include a plurality of heavy metal layers and a plurality of dusting layers interspersed between the plurality of heavy metal layers. The dusting layers may comprise insulating materials or non-insulating materials, and may include cobalt (Co), cobalt iron (CoFe), cobalt iron boron (CoFeB), tantalum (Ta), ruthenium (Ru), magnesium (Mg), magnesium oxide (MgO), iron oxide (FeOx), cobalt oxide (CoOx), tantalum oxide (TaOx), combinations, alloys, or multiples thereof, or the like. In some embodiments, an uppermost layer and a lowermost layer of the SOT structure 16 may include the heavy metal layers. Any number of layers may be included in the SOT structure 16, such as four heavy metal layers and three dusting layers; however a greater or fewer number of the heavy metal layers and the dusting layers may be provided. A ratio of a total thickness of the dusting layers to a total thickness of the heavy metal layers in the SOT structure 16 may range from about 1:19 to about 1:4. In some embodiments, the thicknesses of the layers of the SOT structure 16 may be optimized for the composition and/or other characteristics of the SOT structure 16.

The free layer 18 may be deposited on the SOT structure 16. The free layer 18 acts as a state-keeping layer in a unit cell 102, and its magnetic state determines the state of the unit cell 102. For example, the magnetic moment of the free layer 18 is controllable (e.g., by controlling a current flowing in the SOT structure 16), and by controlling the magnetic moment of the free layer 18 in this manner, the resistance of the unit cell 102 may be put in a high-resistance state or a low-resistance state. Whether the unit cell 102 is in the high-resistance state or the low-resistance state depends on the relative orientations of the spin polarizations of the free layer 18 and the reference layer 22. The free layer 18 may be formed of one or more ferromagnetic materials, such as one or more layers of CoFe, NiFe, CoFeB, CoFeBW, Ru, alloys thereof, the like, or combinations thereof. The free layer 18 may include multiple layers of different materials, such as a layer of Ru between two layers of CoFeB. In some embodiments, the material of the free layer 140A includes a crystalline material deposited to have a particular crystalline orientation, such as a (100) orientation. A suitable thickness of the free layer 18 may be determined by the composition of the free layer 18 or the magnetic properties of the free layer 18.

The barrier layer 20 may be deposited on the free layer 18. In some embodiments, the barrier layer 20 is formed of one or more materials such as MgO, AlO, AlN, the like, or combinations thereof. In some embodiments, the material of the barrier layer 20 includes a crystalline material deposited to have a particular crystalline orientation, such as a (100) orientation. The material of the barrier layer 20 may be deposited to have the same crystalline orientation as the free layer 18. Controlling the thickness of the barrier layer 20 may control the resistance ($R_{MTJ}$) of the MTJ 108. For example, a thicker barrier layer 20 may increase the resistance of the MTJ 108. The barrier layer 20 may be thin enough such that electrons are able to tunnel through the barrier layer 20.

The reference layer 22 may be deposited on the barrier layer 20. The reference layer 22 may be formed of a ferromagnetic material, such as one or more layers of CoFe, NiFe, CoFeB, CoFeBW, alloys thereof, the like, or combinations thereof. In some embodiments, the material of the reference layer 22 includes a crystalline material deposited to have a particular crystalline orientation, such as a (100) orientation. The material of the reference layer 22 may be deposited to have the same crystalline orientation as the barrier layer 20. A suitable thickness of the reference layer 22 may be determined by the composition of the reference layer 22 or the magnetic properties of the reference layer 22.

The electrical resistance through the MTJ 108 varies depending on magnetic orientations of the reference layer 22 and the free layer 18, and this phenomenon is used to store data in the resulting MRAM cells. The reference layer 22 may be a permanent magnet, which is set to a fixed polarity, while the magnetic polarity of the free layer 18 can be changed by application of an electrical field. When the polarity of the free layer 18 matches the polarity of the reference layer 22, the MRAM cell is in the low-resistance state. When the polarity of the free layer 18 is opposite the polarity of the reference layer 22, the MRAM cell is in the high-resistance state.

The pinned layer 24 may be deposited on the reference layer 22. The pinned layer 24 may be configured to pin the magnetization direction of the reference layer 22 by exchange coupling with the reference layer 22. In some embodiments, the pinned layer 24 is formed of an anti-ferromagnetic material. For instance, the anti-ferromagnetic material may include IrMn, PtMn, or $Ni_xMn_{1-x}$ ($0.1<x<0.5$).

In some embodiments, a synthetic anti-ferromagnets (SAF) structure (not separately illustrated) is disposed on the reference layer 22. In such embodiments, the SAF structure may be between the pinned layer 24 and the reference layer 22. The SAF structure may enhance the pinning of the magnetization direction in the reference layer 22, and may include anti-ferromagnetic layers separated by non-magnetic spacer layers. The anti-ferromagnetic layers may include cobalt/platinum (Co/Pt) multilayers, cobalt/palladium (Co/Pd) multilayers or the like; while the spacer layers may include a ruthenium layer or the like. In some embodiments, the multi-layer film stack 15 includes the SAF structure for pinning the magnetization direction in the reference layer 22 and the pinned layer 24 is omitted.

The top electrode layer 26 may be disposed on the pinned layer 24. The top electrode layer 26 may be used to provide electrical connection to a conductive pattern coupled to the top of the MTJ 108. In some embodiments, the top electrode layer 26 may function as a hard mask layer. The top electrode layer 26 may be formed of any suitable material, such as titanium, titanium nitride, tantalum, tantalum nitride, tungsten, the like, or combinations thereof.

The patterned photoresist 28 may be deposited on the top electrode layer 26. The patterned photoresist 28 acts as a mask for etching the layers of the multi-layer film stack 15 to form the MTJ 108. A photoresist layer (not separately illustrated) may be deposited on the top electrode layer 26 using spin-on coating or the like. The photoresist layer may be patterned by exposing the photoresist layer to a patterned energy source (e.g., a patterned light source) and developing the photoresist layer to remove an exposed or an unexposed portion of the photoresist layer, thereby forming the patterned photoresist 28. As illustrated in FIG. 10C, the patterned photoresist 28 may have a rounded shape (such as an oval shape) in a top-down view; however, in some embodiments, the patterned photoresist 28 may have a rectangular or other shape. The patterned photoresist 28 may have a width W2 in a range from about 20 nm to about 30 nm. The patterned photoresist 28 may have a width greater than a width of a portion of the dielectric layer 716 disposed between a pair of adjacent bottom electrode bridges 14. Providing the patterned photoresist 28 with the prescribed with ensures that the SOT structure 16 at least partially overlaps the bottom electrode bridges 14, after subsequent etching, even when the SOT structure 16 is etched through while forming the MTJs 108. As such, the bottom electrode bridges 14 act as etch stop layers during the etching of the SOT structure 16, and damage to underlying structures is prevented.

Figure 11A:
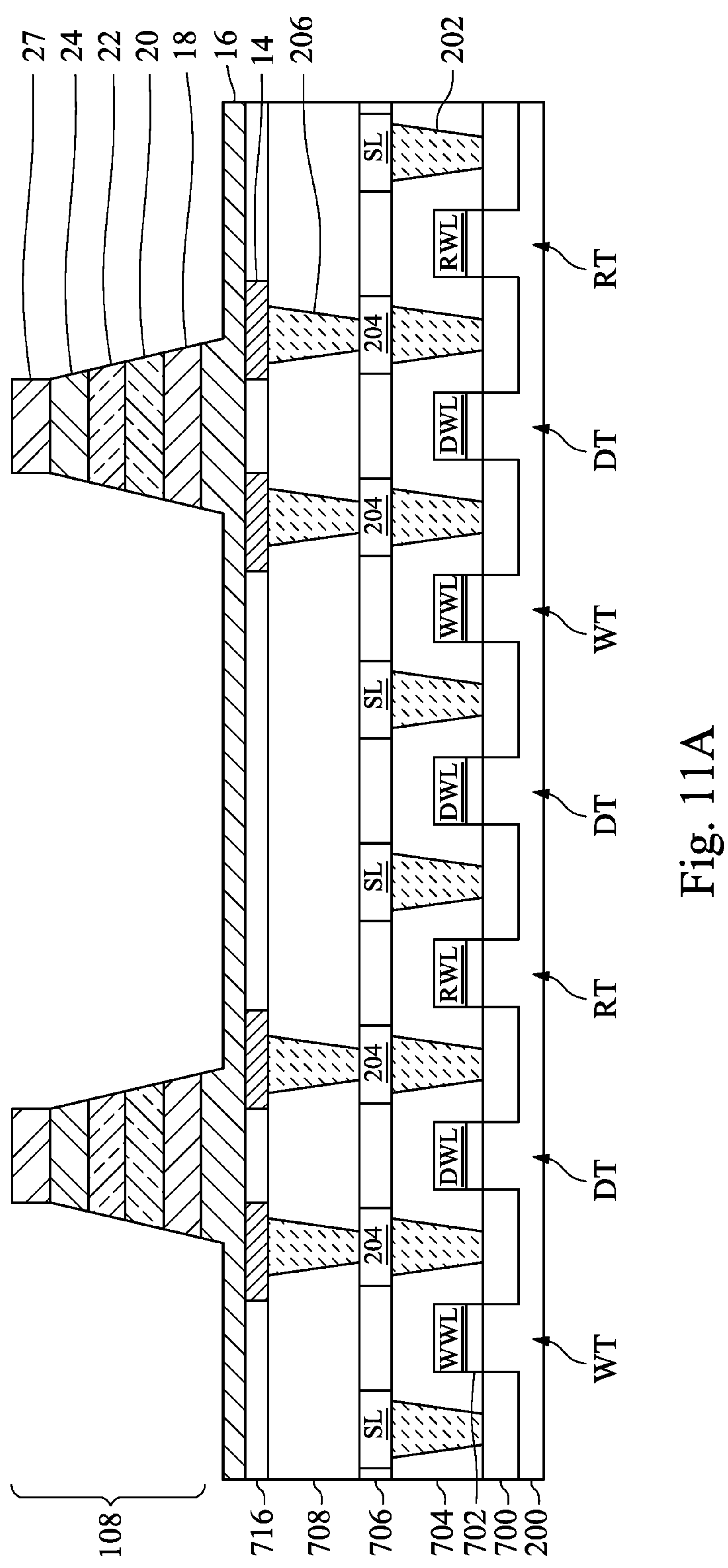
Figure 11C:
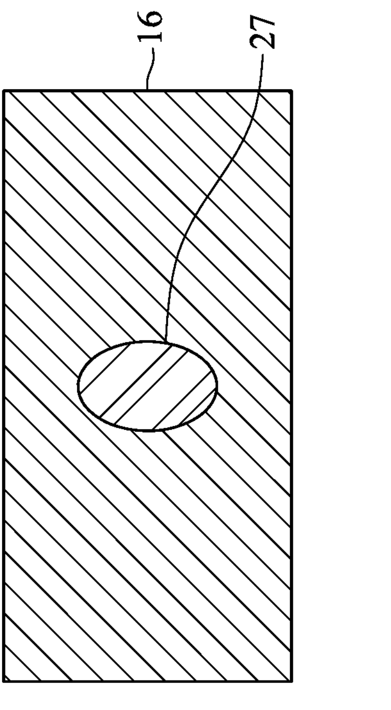
Figure 11B:
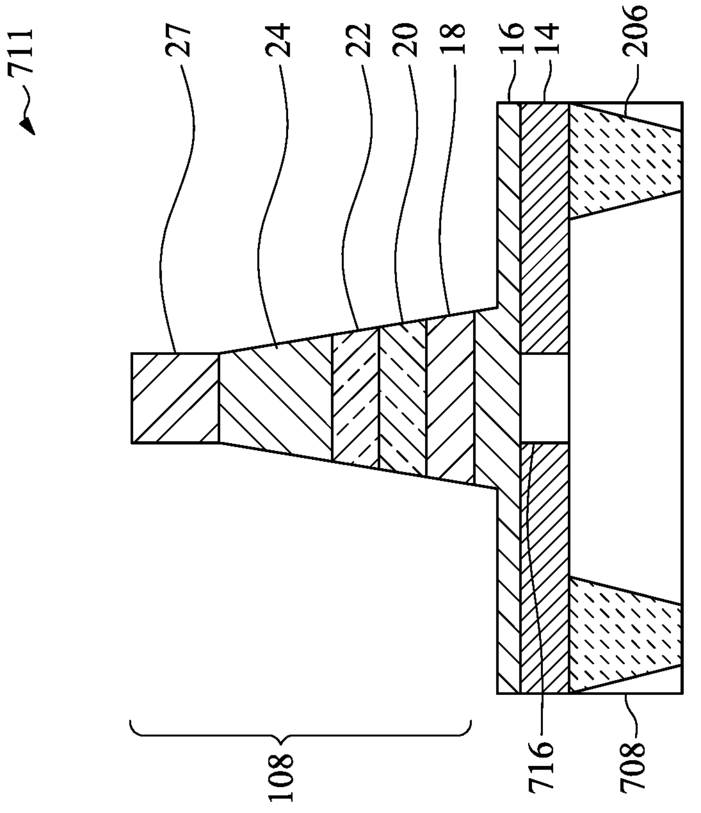

In FIGS. 11A through 11C, the top electrode layer 26, the pinned layer 24, the reference layer 22, the barrier layer 20, the free layer 18, and the SOT structure 16 are patterned and the patterned photoresist 28 is removed. The patterned photoresist 28 is used as a mask to pattern the underlying layers. The top electrode layer 26 is patterned to form top electrodes 27. The combination of a top electrodes 27, the pinned layer 24, the reference layer 22, the barrier layer 20, and the free layer 18 form respective MTJs 108. One or more etching processes (e.g., anisotropic etching processes) may be used to pattern the MTJs 108. In some embodiments, the etching processes may include reactive ion etching (RIE), neutral beam etching (NBE), the like, or a combination thereof. The patterned photoresist 28 may be removed after etching the MTJs 108 by, for example, a stripping process or an ashing process. As illustrated in FIG. 11C, the top electrodes 27 may have rounded shapes (such as oval shapes) in a top-down view; however, in some embodiments, the top electrodes 27 may have rectangular or other shapes. The layers of the MTJs 108 may have tapered side surfaces, which taper in a direction away from the substrate 200. The SOT structure 16 may include tapered side surfaces, which taper in a direction away from the substrate 200, and which are continuous with the tapered side surfaces of the MTJs 108.

Although FIGS. 11A through 11C illustrate the SOT structure 16 as being etched partially through, as will be discussed in detail below, the SOT structure 16 may remain relatively un-etched after forming the MTJs 108, or may be etched through during the formation of the MTJs 108. In embodiments in which the SOT structure 16 is etched through, the bottom electrode bridges 14 act as etch stop layers for the etching of the SOT structure 16. This prevents over-etching of the underlying structures and prevents damage to the dielectric layer 716, increases the processing window for the SOT structure 16, prevents shunting current underneath the MTJs 108, reduces device defects, and improves device performance.

Figure 12A:
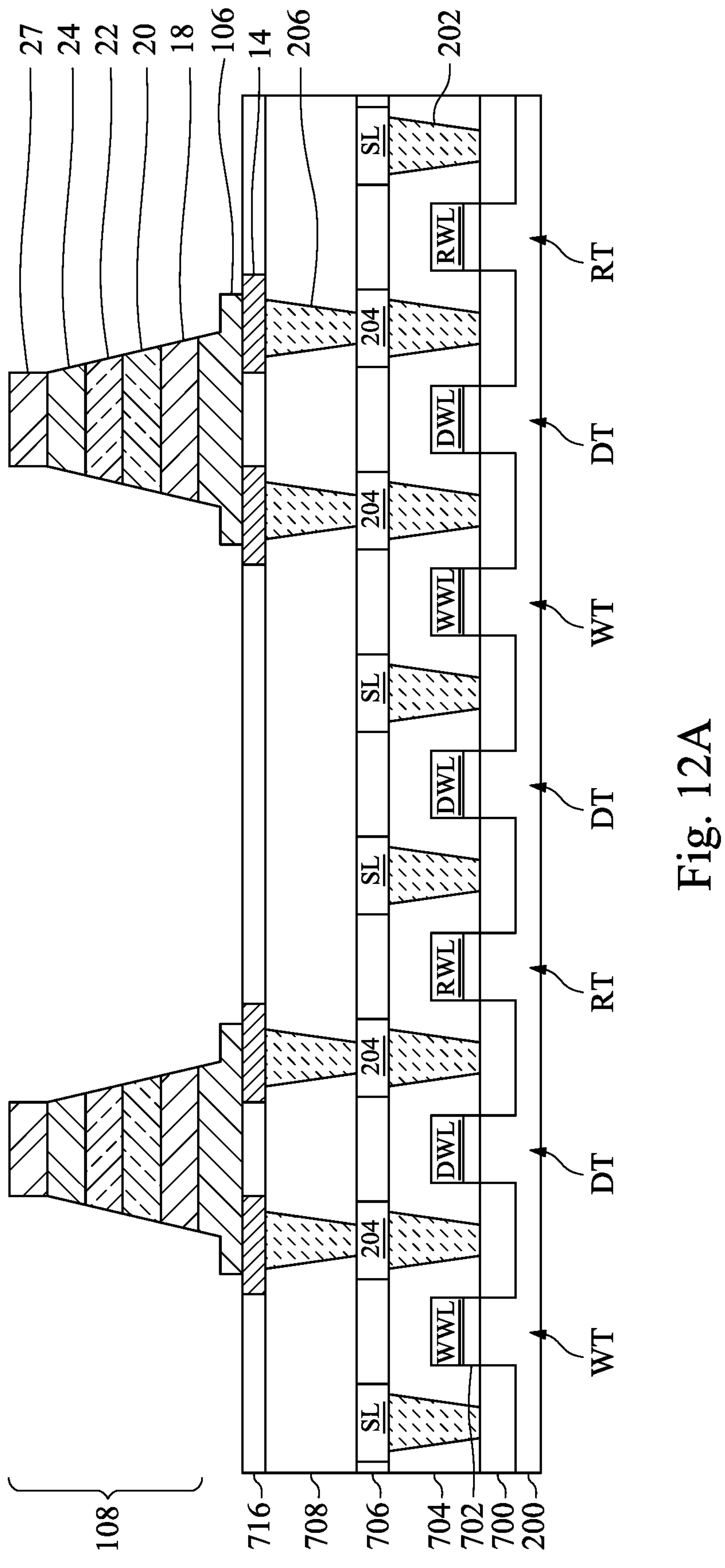
Figures 12B, 12C:
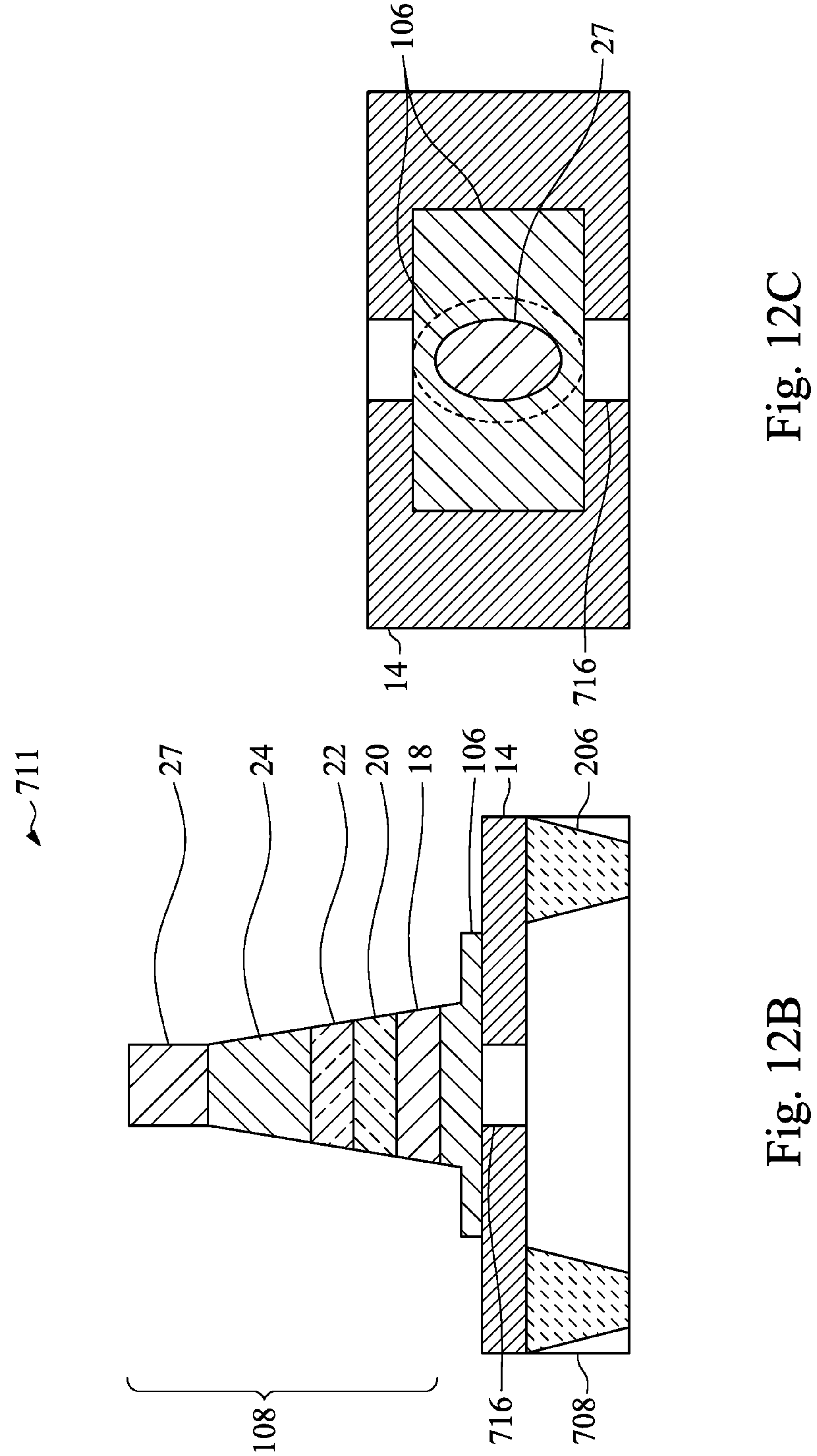

In FIGS. 12A through 12C, the SOT structure 16 is patterned to form SOT structures 106. The SOT structure 16 may be patterned using suitable photolithography and etching techniques. As illustrated in FIG. 12C, the SOT structures 106 may have rectangular shapes in a top-down view; however, in some embodiments, the SOT structures 106 may have rounded or other shapes. The SOT structures 106 may have stepped structures due to the etching of the SOT structure 16 when forming the MTJs 108. Top portions of the SOT structures 106 may have rounded shapes in the top-down view, while bottom portions of the SOT structures 106 have rectangular shapes in the top-down view. As illustrated in FIGS. 12A through 12C, side surfaces of each SOT structure 106 may be disposed laterally within side surfaces of a pair of the bottom electrode bridges 14. Thus, the bottom electrode bridges 14 act as etch stop layers during the etching of the SOT structure 16. This prevents over-etching of the underlying structures and prevents damage to the dielectric layer 716, increases the processing window for the SOT structure 16, allows the SOT structure 16 to be etch through ensuring good TMR, prevents shunting current underneath the MTJs 108, reduces device defects, and improves device performance. In some embodiments, side surfaces of the SOT structures 106 may be laterally aligned with side surfaces of the bottom electrode bridges 14.

Figure 13:
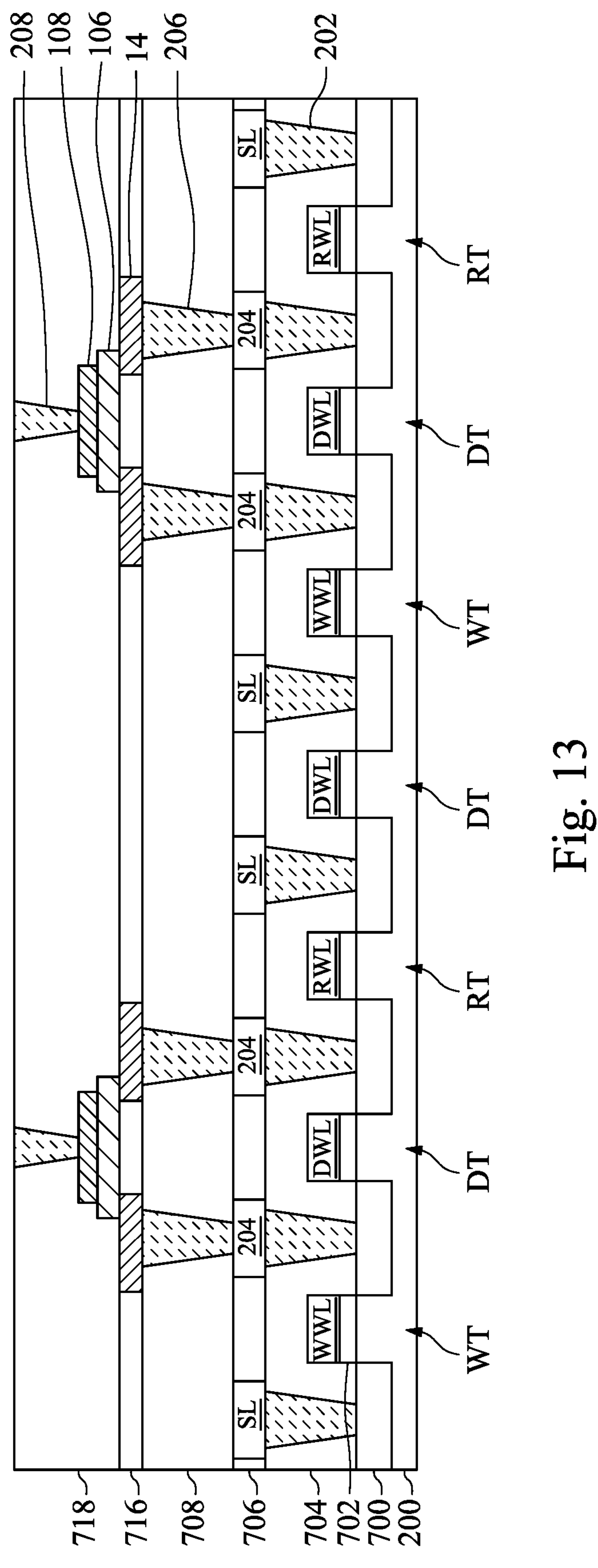

In FIG. 13, a dielectric layer 718 is formed on the structure of FIGS. 12A through 12C and top vias 208 are formed in the dielectric layer 718. The MTJs 108 and the SOT structures 106 have been simplified in FIG. 13 and subsequent figures for ease of illustration. The dielectric layer 718 may be deposited on the MTJs 108, the SOT structures 106, the bottom electrode bridges 14, and the dielectric layer 716. The dielectric layer 718 may be formed of materials similar to or the same as the materials of the dielectric layer 704. The dielectric layer 718 may be formed using an acceptable deposition process, such as spin coating, PVD, CVD, the like, or a combination thereof.

The top vias 208 may be formed by patterning the dielectric layer 718 to form openings (not separately illustrated) exposing the MTJs 108. The dielectric layer 718 may be patterned using suitable photolithography and etching processes. For example, a photoresist structure (not separately illustrated) may be formed on the dielectric layer 718 and patterned. The openings may be formed by etching the dielectric layer 718 using the patterned photoresist structure as an etching mask. The dielectric layer 718 may be etched using a suitable etching process, such as a wet etching process or a dry etching process. The patterned photoresist structure may then be removed, such as by an acceptable ashing process. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, ruthenium, cobalt, aluminum, nickel, or the like. A planarization process, such as a CMP, may be performed to remove excess material from over surfaces of the dielectric layer 718. The remaining portions of the liner and the conductive material form the top vias 208 in the openings. The top vias 208 may be physically and electrically coupled to the MTJs 108. The dielectric layer 718 may laterally surround the SOT structures 106, the MTJs 108, and the top vias 208.

Figure 14:
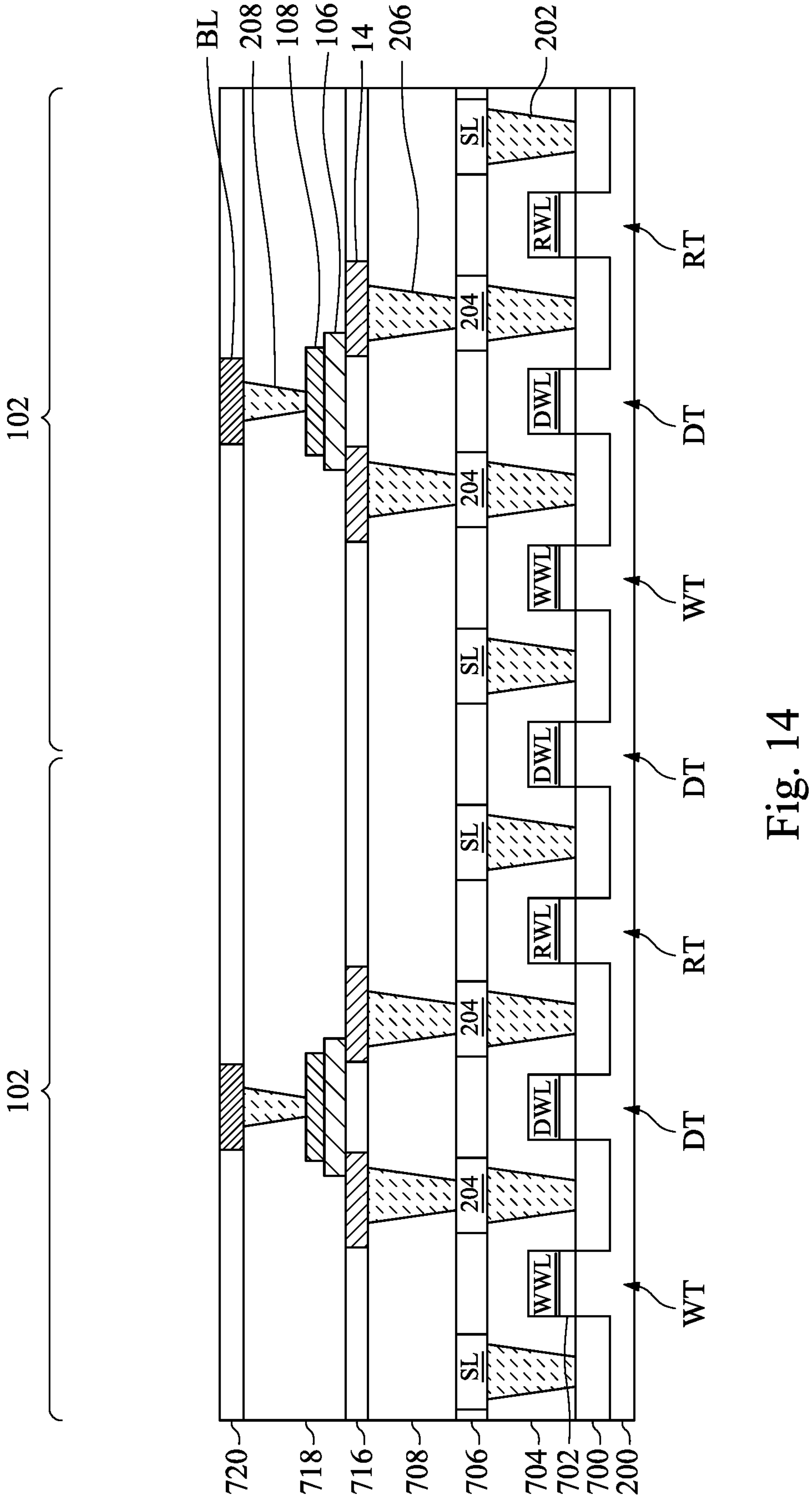

In FIG. 14, a dielectric layer 720 and bit lines BL are formed on the dielectric layer 718 and the top vias 208. The dielectric layer 720 may laterally surround the bit lines BL. The bit lines BL may be physically and electrically coupled to the top vias 208. In some embodiments, a method for forming the dielectric layer 720 and the bit lines BL includes a damascene process (e.g., a single damascene process). In some embodiments, the dielectric layer 718, the dielectric layer 720, the top vias 208, and the bit lines BL are formed by a dual damascene process.

Further in FIG. 14, unit cells 102 are formed. Each of the unit cells 102 includes a bit line BL, an MTJ 108, an SOT structure 106, two bottom electrode bridges 14, two bottom vias 206, two source lines SL, a write word line WWL, a read word line RWL, a write transistor WT, and a read transistor WT. The bottom electrode bridges 14 may reduce contact resistance between the SOT structures 106 and the bottom vias 206. The bottom electrode bridges 14 act as etch stop layers during the patterning of the SOT structures 106, which prevents damage to underlying layers (such as the dielectric layer 716 and the dielectric layer 708), enhances the process window for patterning the SOT structures 106, ensures good TMR, reduces device defects, improves device performance, and improves yield.

Although the SOT structures 106 and the MTJs 108 are described as being formed between first and second metallization layers from the bottom of the BEOL structure BE, the SOT structures 106 and the MTJs 108 may be alternatively formed between other vertically adjacent metallization layers in the BEOL structure BE, and more conductive features may be formed in the BEOL structure BE for routing the SOT structures 106 and the MTJs 108. Further BEOL processes may be performed to form a semiconductor device. The semiconductor devices may be subjected to packaging processes to form packaged semiconductor devices.

Figures 15A, 15B:
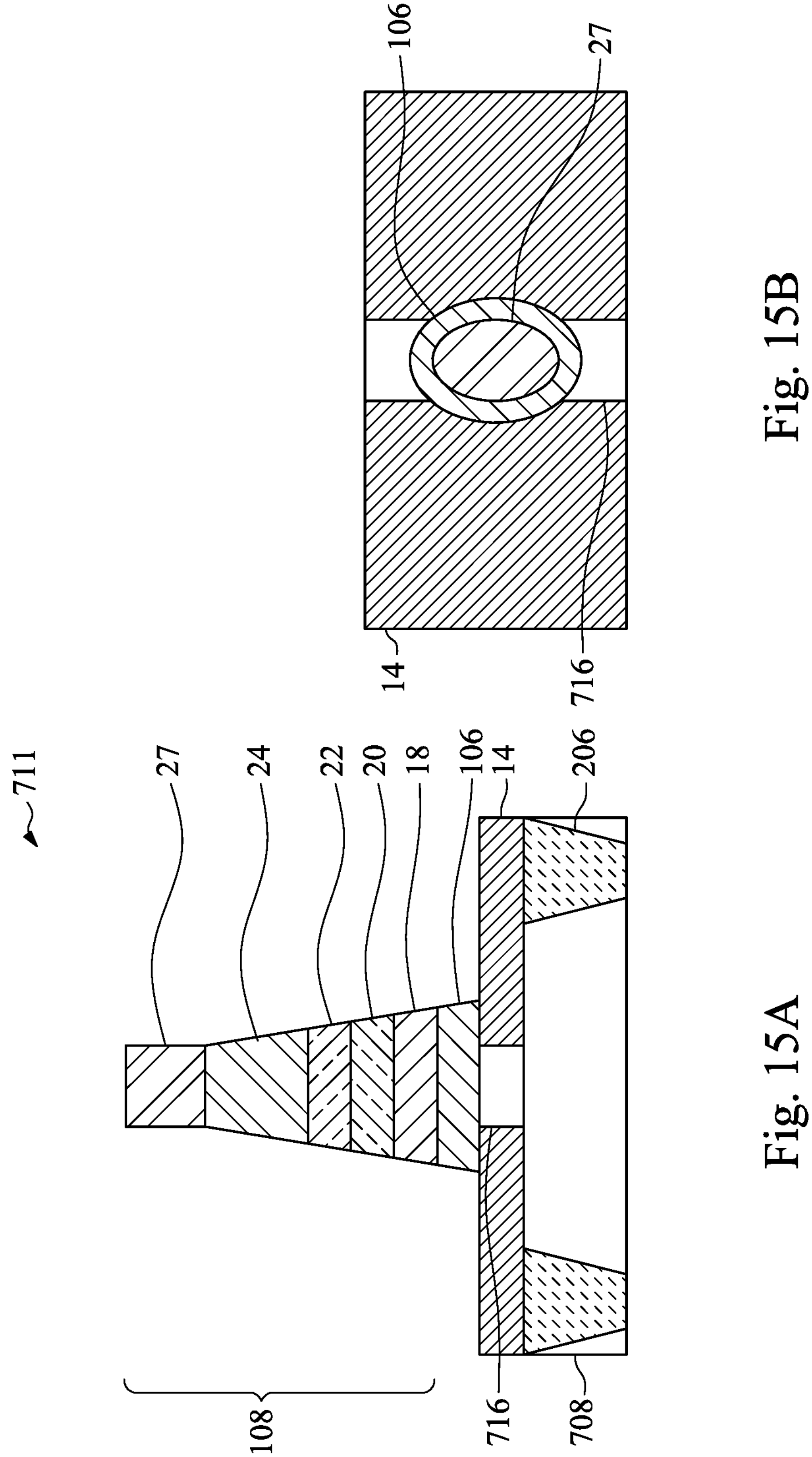

FIGS. 15A and 15B illustrate an embodiment in which the SOT structure 16 is etched through to form SOT structures 106 during the etching processes used to pattern the MTJs 108. The etching processes used to etch through the SOT structure 16 and form the SOT structures 106 may be the same as or similar to the processes discussed above with respect to FIGS. 11A through 11C, except that the SOT structure 16 is etched for a longer period of time. The layers of the MTJs 108 may have tapered side surfaces, which taper in a direction away from the substrate 200. The SOT structures 106 may include tapered side surfaces, which taper in a direction away from the substrate 200, and which are continuous with the tapered side surfaces of the MTJs 108.

As illustrated in FIGS. 15A and 15B, the SOT structures 106 at least partially overlap the bottom electrode bridges 14. Opposite side surface of the SOT structures 106 may each be laterally between opposite side surfaces of the underlying bottom electrode bridges 14. The bottom electrode bridges 14 act as etch stop layers for the etching of the SOT structure 16 to form the SOT structures 106. This prevents over-etching of the underlying structures (such as the dielectric layer 716 and the dielectric layer 708), prevents damage to the underlying structures, increases the processing window for the SOT structure 16, reduces device defects, and improves device yield. Moreover, forming the SOT structures 106 extending at least partially on the bottom electrode bridges prevents shunting current underneath the MTJs 108 and improves TMR, improving device performance. The SOT structures 106 may be disposed between the bottom vias 206, without overlapping the bottom vias 206. As illustrated in FIG. 15B, the SOT structures 106 may have rounded shapes (such as oval shapes) in a top-down view; however, in some embodiments, the SOT structures 106 and the MTJs 108 may have rectangular or other shapes.

Figures 16A, 16B:
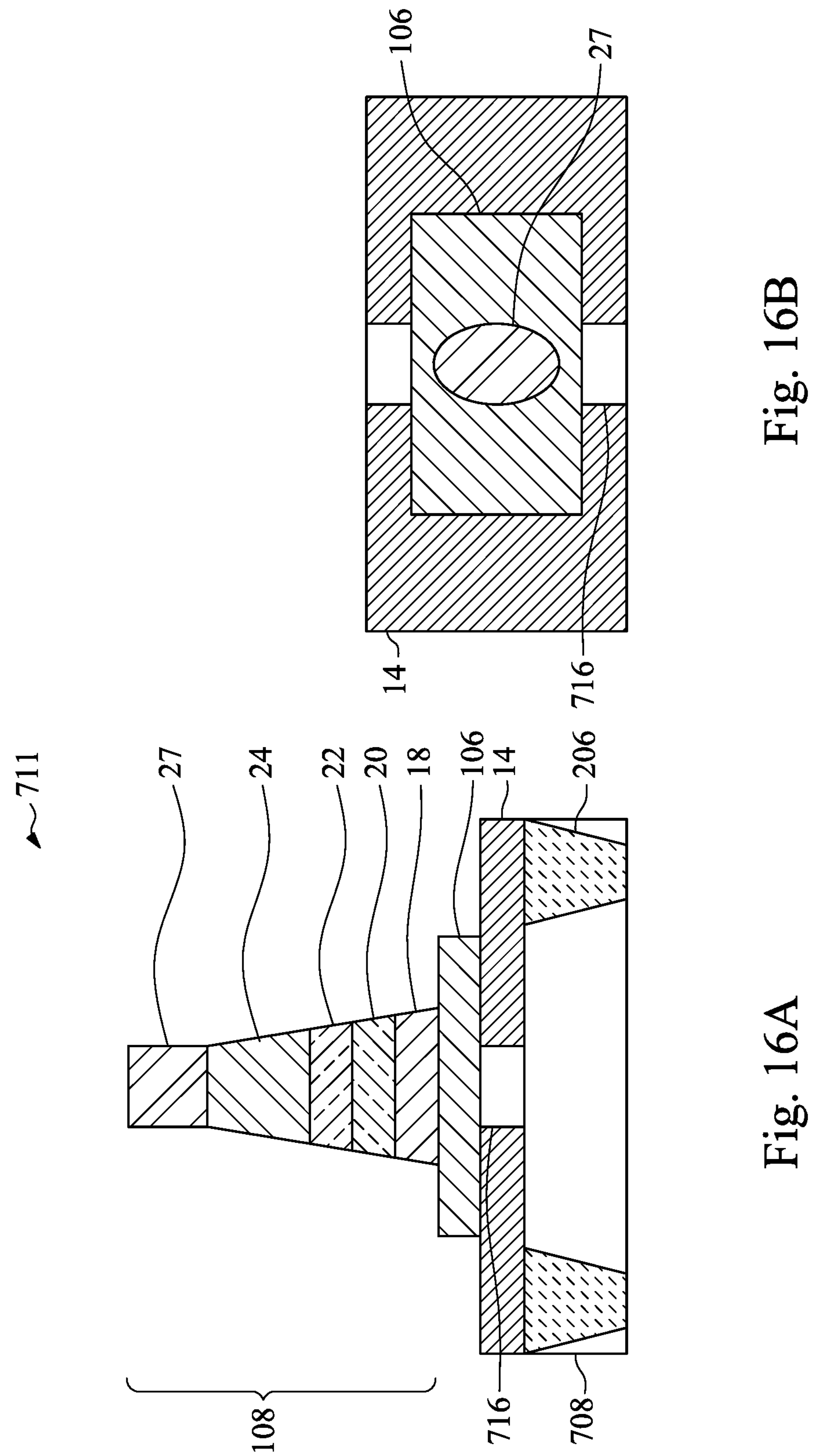

FIGS. 16A and 16B illustrate an embodiment in which the SOT structure 16 is substantially un-etched by the etching processes used to pattern the MTJs 108. The SOT structure 16 may be etched by processes the same as or similar to those discussed above with respect to FIGS. 12A through 12C to form SOT structures 106. The SOT structures 106 may have planar top surfaces, which do not have a stepped profile. In the embodiment of FIGS. 16A and 16B, the SOT structure 16 acts as an etch stop layer for the patterning of the MTJs 108, and the bottom electrode bridges 14 act as etch stop layers for the patterning of the SOT structures 106.

As illustrated in FIGS. 16A and 16B, the SOT structures 106 at least partially overlap the bottom electrode bridges 14. Opposite side surface of the SOT structures 106 may each be laterally between opposite side surfaces of the underlying bottom electrode bridges 14. Utilizing the bottom electrode bridges 14 as etch stop layers during the patterning of the SOT structures 106 prevents over-etching of the underlying structures (such as the dielectric layer 716 and the dielectric layer 708), prevents damage to the underlying structures, increases the processing window for the SOT structures 106, reduces device defects, and improves device yield. Moreover, forming the SOT structures 106 extending at least partially on the bottom electrode bridges prevents shunting current underneath the MTJs 108 and improves TMR, improving device performance. As illustrated in FIG. 16B, the SOT structures 106 may have rectangular shapes in a top-down view; however, in some embodiments, the SOT structures 106 may have rounded or other shapes.

Figures 17A, 17B:
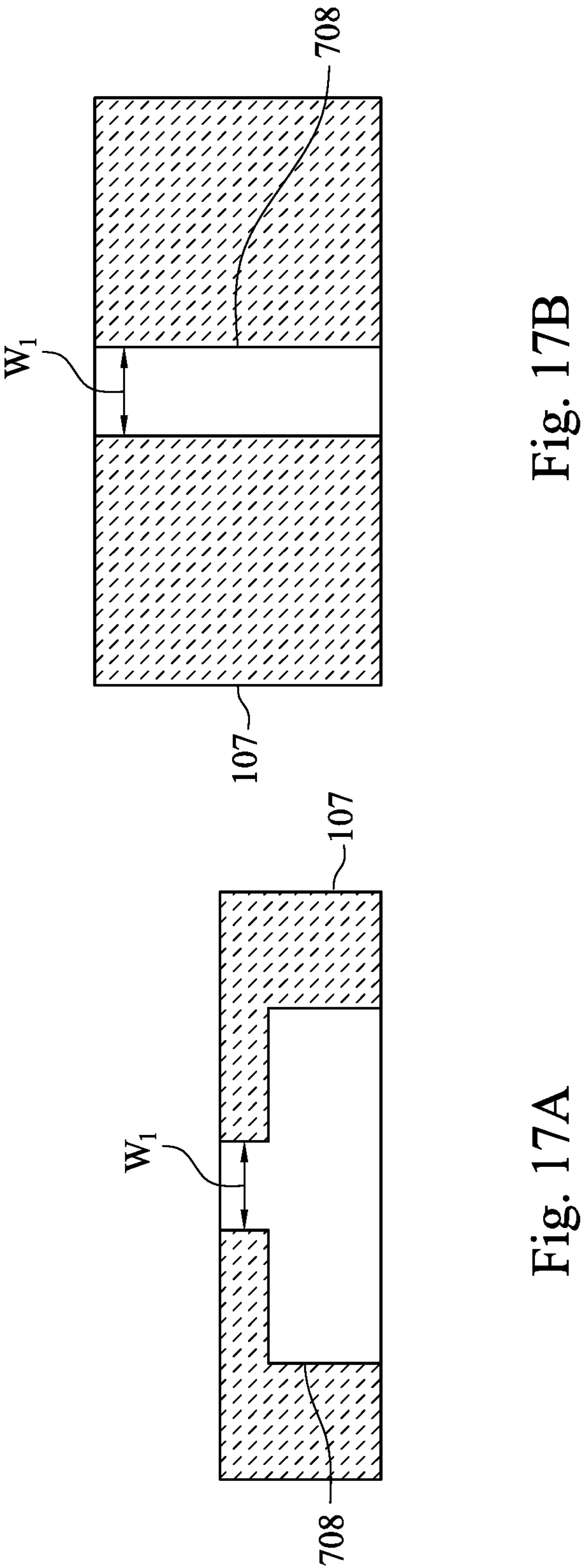

FIGS. 17A and 17B illustrate an embodiment in which bottom electrodes 107 are formed in the dielectric layer 708 by a dual damascene process. In this embodiment, the dielectric layer 716 is omitted, and the separate bottom electrode bridges 14 and bottom vias 206 are replaced by the bottom electrodes 107. The bottom electrodes may be formed by patterning the dielectric layer 708 to form first openings (not separately illustrated). The dielectric layer 708 may be patterned using suitable photolithography and etching processes. For example, a first photoresist structure (not separately illustrated) may be formed on the dielectric layer 708 and patterned. The first openings may be formed by etching the dielectric layer 708 using the first patterned photoresist structure as an etching mask. The dielectric layer 708 may be etched using a suitable etching process, such as a wet etching process or a dry etching process. The patterned photoresist structure may then be removed, such as by an acceptable ashing process. This patterning process is then repeated with a second patterned photoresist to extend the first openings and form second openings (not separately illustrated). The bottom electrodes 107 are then deposited in the first openings and the second openings. The bottom electrodes 107 may be formed of suitable materials, such as tungsten (W), platinum (Pt), tantalum (Ta), tantalum nitride (TaN), titanium nitride (TiN), aluminum (Al), combinations or multiple layers thereof, or the like. The bottom electrodes 107 may be deposited using suitable processes, such as CVD, PVD, ALD, plating, or the like. The bottom electrodes 107 may be formed of conductive materials having high etch resistances to relative to materials of the SOT structures 106, which allows for the bottom electrodes 107 to act as etch stop layers. Forming the bottom electrodes 107 by dual damascene processes reduces the materials and processing steps used to form the unit cells 102, reduces costs, and reduces the thicknesses of the unit cells 102.

Portions of the dielectric layer 708 remaining laterally between adjacent bottom electrodes 107 may have widths W1 ranging from about 20 nm to about 200 nm. Etching the dielectric layer 708 such that remaining portions of the dielectric layer 708 between the bottom electrodes 107 have the prescribed widths ensures that the bottom electrodes 107 are isolated from one another, and the SOT structures 106 subsequently formed on the bottom electrodes 107 extend over the bottom electrodes 107, without having excessive lengths.

Figure 18:
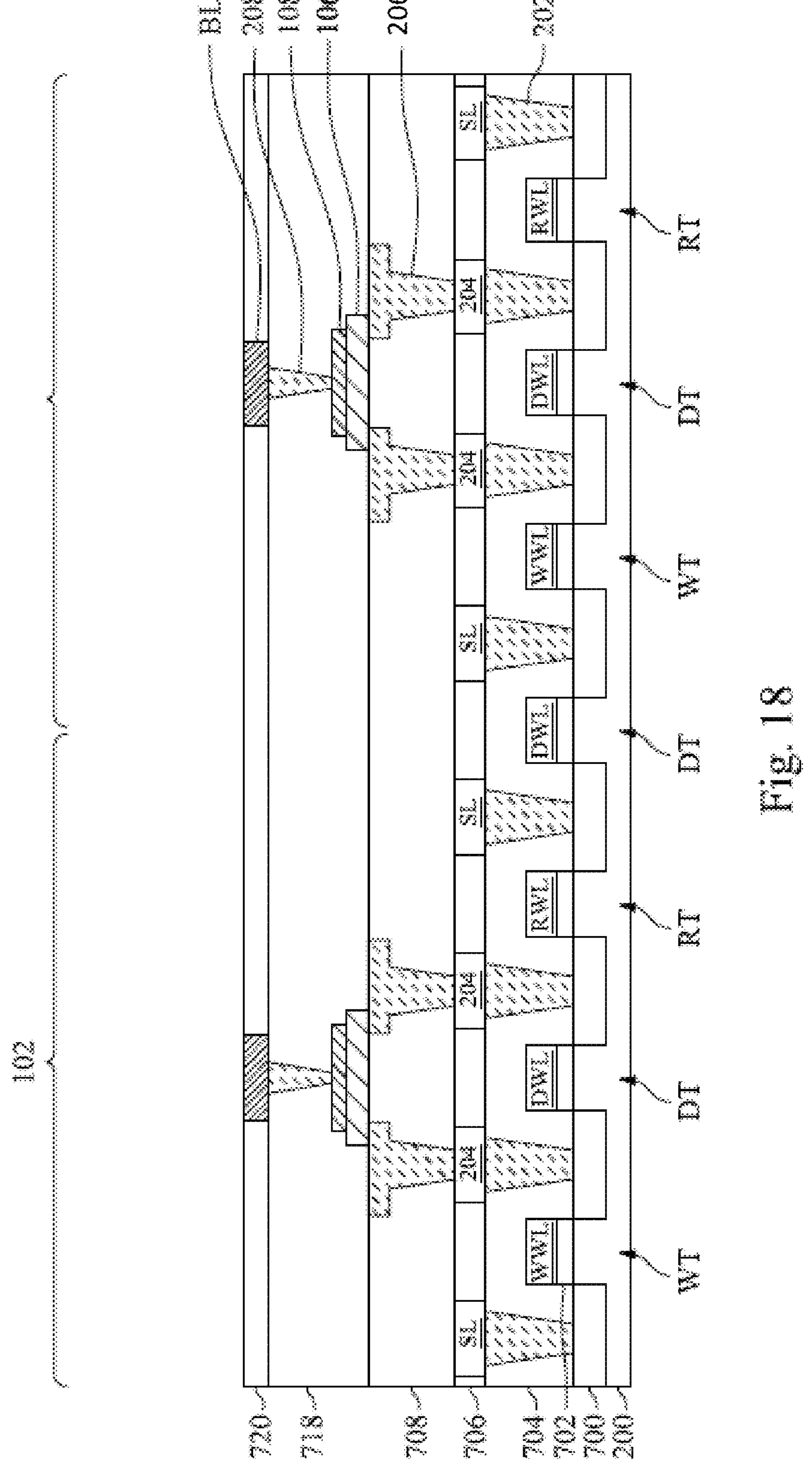

FIG. 18 illustrates the embodiment of FIGS. 17A and 17B after processes the same as or similar to those discussed above with respect to FIGS. 10A through 14 are performed to form SOT structures 106, MTJs 108, top vias 208, bit lines BL, a dielectric layer 718 laterally surrounding the SOT structures 106, the MTJs 108, and the top vias 208 and a dielectric layer 720 laterally surrounding the bit lines BL. As discussed previously, forming the bottom electrodes 107 by dual damascene processes reduces the materials and processing steps used to form the unit cells 102, reduces costs, and reduces the thicknesses of the unit cells 102, while still providing benefits the same as or similar to those obtained by including the bottom electrode bridges 14.

Embodiments may achieve advantages. For example, the bottom electrode bridges 14 may be formed of a variety of materials, and may reduce contact resistance between the bottom vias 206 and the SOT structures 106. The bottom electrode bridges 14 may act as etch stop layers during patterning of the MTJs and the SOT structures 106, and may prevent damage to underlying structures. The SOT structures 106 may be patterned to extend at least partially along the bottom electrode bridges 14, further reducing contact resistance between the SOT structures 106 and the bottom electrode bridges 14, reducing shunting under the MTJs, and improving TMR. As such, device defects may be reduced, device yield may be improved, and device performance may be increased.

In accordance with an embodiment, a memory includes a first electrode on a first via; a second electrode on a second via; a spin-orbit torque (SOT) structure physically and electrically coupled to the first electrode and the second electrode, the SOT structure overlapping the first electrode and the second electrode; and a magnetic tunnel junction (MTJ) on the SOT structure. In an embodiment, the SOT structure has a stepped structure. In an embodiment, the SOT structure includes first side surfaces having a rectangular shape in a top-down view, and the SOT structure includes second side surfaces having a rounded shape in the top-down view. In an embodiment, the MTJ and the SOT structure have rounded shapes in a top-down view. In an embodiment, the SOT structure has a rectangular shape in a top-down view, and the MTJ has a rounded shape in the top-down view. In an embodiment, a first portion of a top surface of the first electrode is physically coupled to the SOT structure, and a second portion of the top surface of the first electrode is free from contact with the SOT structure. In an embodiment, the first electrode is separated from the second electrode by a first distance in a first direction, and the MTJ has a first width in the first direction greater than the first distance. In an embodiment, the first distance is greater than or equal to 20 nm, and the first width is less than or equal to 30 nm. In an embodiment, the SOT structure includes a multi-layer stack including alternating layers of a heavy metal material and a first material different from the heavy metal material. In an embodiment, the heavy metal material includes tungsten, platinum, or tantalum, and the first material includes cobalt, cobalt iron, cobalt iron boron, tantalum, ruthenium, magnesium, magnesium oxide, iron oxide, cobalt oxide, or tantalum oxide.

In accordance with another embodiment, a method includes forming a first bottom electrode bridge and a second bottom electrode bridge in a first dielectric layer; depositing a spin-orbit torque (SOT) structure on the first dielectric layer, the first bottom electrode bridge, and the second bottom electrode bridge; depositing a magnetic tunnel junction (MTJ) stack on the SOT structure; forming a patterned photoresist on the MTJ stack, the patterned photoresist having a first width in a first direction greater than a first distance between the first bottom electrode bridge and the second bottom electrode bridge in the first direction; and patterning the MTJ stack to form a MTJ using the patterned photoresist as a mask. In an embodiment, the method further includes forming a first via and a second via in a second dielectric layer; depositing the first dielectric layer on the first via, the second via, and the second dielectric layer; and etching the first dielectric layer to form first openings exposing the first via and the second via, the first bottom electrode bridge and a second bottom electrode bridge being formed in the first openings and are electrically coupled to the first via and the second via, respectively. In an embodiment, the SOT structure is partially etched by patterning the MTJ stack such that the SOT structure has a stepped structure after patterning the MTJ stack. In an embodiment, the SOT structure is etched through by patterning the MTJ stack such that the SOT structure has continuous sidewalls with the MTJ stack after patterning the MTJ stack.

In accordance with yet another embodiment, a memory device includes a first dielectric layer on a semiconductor substrate; a first bottom electrode in the first dielectric layer; a second bottom electrode in the first dielectric layer; a spin-orbit torque (SOT) structure on the first bottom electrode and the second bottom electrode; and a magnetic tunnel junction (MTJ) on the SOT structure, the MTJ overlapping the first bottom electrode and the second bottom electrode in a first direction perpendicular to a major surface of the semiconductor substrate. In an embodiment, the first bottom electrode and the second bottom electrode include tungsten, platinum, tantalum, tantalum nitride, titanium nitride, or aluminum. In an embodiment, the SOT structure includes a multi-layer stack including alternating layers of a heavy metal material and a first material different from the heavy metal material, and a ratio of a total thickness of the layers including the first material to a total thickness of the layers including the heavy metal material is in a range from 1:19 to 1:4. In an embodiment, the SOT structure includes four layers of the heavy metal material and three layers of the first material. In an embodiment, the SOT structure is physically and electrically coupled to the first bottom electrode and the second bottom electrode. In an embodiment, the first bottom electrode is separated from the second bottom electrode by a first distance greater than 20 nm in a second direction parallel to the major surface of the semiconductor substrate, and the MTJ has a first width in the second direction less than 30 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory comprising:

a first electrode on a first via, wherein first via side surfaces for the first via are disposed laterally within first electrode side surfaces for the first electrode;

a second electrode on a second via, wherein second via side surfaces for the second via are disposed laterally within second electrode side surfaces for the second electrode, wherein the first electrode is spaced apart from the second electrode along a first direction in a top-down view by a first distance;

a spin-orbit torque (SOT) structure physically and electrically coupled to the first electrode and the second electrode, wherein the SOT structure overlaps the first electrode and the second electrode, and outer SOT side surfaces for the SOT structure are laterally disposed within a perimeter defined by the first electrode side surfaces for the first electrode and the second electrode side surfaces for the second electrode, wherein along a second direction, the first electrode extends laterally past edges of the SOT structure in the top-down view, wherein along the second direction, the second electrode extends laterally past edges of the SOT structure in the top-down view, wherein the second direction is perpendicular to the first direction, wherein a width of a bottom surface of the SOT structure measured along the first direction is greater than a width of a top surface of the SOT structure measured along the first direction, and wherein the width of the top surface of the SOT structure is greater than the first distance; and a magnetic tunnel junction (MTJ) on the SOT structure, wherein a width of a bottom surface of the MTJ measured along the first direction is greater than the first distance and less than the width of the bottom surface of the SOT structure measured along the first direction.

2. The memory of claim 1, wherein the SOT structure has a stepped structure.

3. The memory of claim 2, wherein the outer SOT side surfaces for the SOT structure comprises first side surfaces having a rectangular shape in the top-down view, and wherein the SOT structure comprises second side surfaces having a rounded shape in the top-down view.

4. The memory of claim 1, wherein the MTJ and the SOT structure have rounded shapes in the top-down view.

5. The memory of claim 1, wherein the SOT structure has a rectangular shape in the top-down view, and wherein the MTJ has a rounded shape in the top-down view.

6. The memory of claim 1, wherein a first portion of a top surface of the first electrode is physically coupled to the SOT structure, and wherein a second portion of the top surface of the first electrode is free from contact with the SOT structure.

7. The memory of claim 1, wherein the first distance is greater than or equal to 20 nm, and wherein the width of the bottom surface of the MTJ measured along the first direction is less than or equal to 30 nm.

8. The memory of claim 1, wherein the SOT structure comprises a multi-layer stack comprising alternating layers of a heavy metal material and a first material different from the heavy metal material.

9. The memory of claim 8, wherein the heavy metal material comprises tungsten, platinum, or tantalum, and wherein the first material comprises cobalt, cobalt iron, cobalt iron boron, tantalum, ruthenium, magnesium, magnesium oxide, iron oxide, cobalt oxide, or tantalum oxide.

10. The memory of claim 1, wherein a width of a top surface of the MTJ measured along the first direction is equal to the first distance and less than the width of the bottom surface of the MTJ measured along the first direction.

11. A method comprising:

forming a first bottom electrode bridge and a second bottom electrode bridge in a first dielectric layer;

depositing a spin-orbit torque (SOT) layer structure on the first dielectric layer, the first bottom electrode bridge, and the second bottom electrode bridge;

depositing a magnetic tunnel junction (MTJ) stack on the SOT layer structure;

forming a patterned photoresist on the MTJ stack, wherein the patterned photoresist has a first width in a first direction greater than a first distance between the first bottom electrode bridge and the second bottom electrode bridge in the first direction, and less than a second distance between outer sidewalls of the first bottom electrode bridge and the second bottom electrode bridge;

performing a first etching process on the MTJ stack and an upper portion of the SOT layer structure, wherein the first etching process forms a first upper sidewall and a second upper sidewall of the SOT layer structure; and after performing the first etching process performing a second etching process on a lower portion of the SOT layer structure, wherein the second etching process forms a first lower sidewall and a second lower sidewall of the SOT layer structure, wherein a first lateral distance between the first upper sidewall and the second upper sidewall is less than a second lateral distance between the first lower sidewall and the second lower sidewall, and wherein the second etching process ends on the first bottom electrode bridge and the second bottom electrode bridge.

12. The method of claim 11, further comprising:

forming a first via and a second via in a second dielectric layer;

depositing the first dielectric layer on the first via, the second via, and the second dielectric layer; and etching the first dielectric layer to form first openings exposing the first via and the second via, wherein the first bottom electrode bridge and the second bottom electrode bridge are formed in the first openings and are electrically coupled to the first via and the second via, respectively.

13. The method of claim 11, wherein the first etching process etches the SOT layer structure and etches the MTJ stack such that the first upper sidewall and the second upper sidewall of the SOT layer structure are continuous sidewalls with the MTJ stack.

14. A memory device comprising:

a first dielectric layer on a semiconductor substrate, the first dielectric layer over a first via and a second via;

a first bottom electrode in the first dielectric layer, the first bottom electrode on the first via, wherein first via side surfaces for the first via are disposed laterally within first electrode side surfaces for the first bottom electrode;

a second bottom electrode in the first dielectric layer, the second bottom electrode on the second via, wherein second via side surfaces for the second via are disposed laterally within second electrode side surfaces for the second bottom electrode, wherein the first bottom electrode is spaced apart from the second bottom electrode along a first direction in a top-down view;

a spin-orbit torque (SOT) structure on the first bottom electrode and the second bottom electrode, wherein outer SOT side surfaces for the SOT structure are laterally disposed within a perimeter defined by outer side surfaces for the first electrode side surfaces for the first bottom electrode and the second electrode side surfaces of the second bottom electrode, wherein along a second direction, the first bottom electrode extends laterally past edges of the SOT structure, wherein along the second direction, the second bottom electrode extends laterally past edges of the SOT structure, wherein the second direction is perpendicular to the first direction, wherein the first direction and the second direction are parallel to a major surface of the semiconductor substrate, wherein a bottom surface of the SOT structure is wider than a top surface of the SOT structure along the first direction, and wherein the top surface of the SOT structure overlaps the first bottom electrode and the second bottom electrode in a cross-sectional view; and a magnetic tunnel junction (MTJ) on the SOT structure, wherein a bottom surface of the MTJ overlaps the first bottom electrode and the second bottom electrode in a third direction perpendicular to the major surface of the semiconductor substrate, and wherein the bottom surface of the SOT structure is wider than the bottom surface of the MTJ along the first direction.

15. The memory device of claim 14, wherein the first bottom electrode and the second bottom electrode comprise tungsten, platinum, tantalum, tantalum nitride, titanium nitride, or aluminum.

16. The memory device of claim 14, wherein the SOT structure comprises a multi-layer stack comprising alternating layers of a heavy metal material and a first material different from the heavy metal material, and wherein a ratio of a total thickness of the layers comprising the first material to a total thickness of the layers comprising the heavy metal material is in a range from 1:19 to 1:4.

17. The memory device of claim 16, wherein the SOT structure comprises four layers of the heavy metal material and three layers of the first material.

18. The memory device of claim 14, wherein the SOT structure is physically and electrically coupled to the first bottom electrode and the second bottom electrode.

19. The memory device of claim 14, wherein the first bottom electrode is separated from the second bottom electrode by a first distance greater than 20 nm in the first direction, and wherein the MTJ has a first width in the first direction less than 30 nm.

* * * * *